United States Patent
Min et al.

(10) Patent No.: US 10,962,835 B2
(45) Date of Patent: Mar. 30, 2021

(54) INORGANIC COMPOSITE LUMINESCENT MATERIAL, LIGHT-EMITTING FILM, LIGHT-EMITTING DIODE PACKAGE, LIGHT EMITTING DIODE AND LIGHT-EMITTING DEVICE INCLUDING THE SAME

(71) Applicant: LG Display Co., Ltd., Seoul (KR)

(72) Inventors: Hye-Li Min, Paju-si (KR); Byung-Geol Kim, Paju-si (KR); Dong-Young Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 339 days.

(21) Appl. No.: 16/134,413

(22) Filed: Sep. 18, 2018

(65) Prior Publication Data

US 2019/0086733 A1 Mar. 21, 2019

(30) Foreign Application Priority Data

Sep. 19, 2017 (KR) .......................... 10-2017-0120435

(51) Int. Cl.
*G02F 1/13357* (2006.01)
*H01L 33/50* (2010.01)
(Continued)

(52) U.S. Cl.
CPC ...... *G02F 1/133617* (2013.01); *C09K 11/025* (2013.01); *C09K 11/703* (2013.01);
(Continued)

(58) Field of Classification Search
CPC ..... C09K 11/02; C09K 11/703; H01L 33/502; G02F 1/133617; B82Y 20/00
See application file for complete search history.

(56) References Cited

U.S. PATENT DOCUMENTS

| | | | | |
|---|---|---|---|---|
| 8,350,465 | B2 * | 1/2013 | Winkler | C09K 11/7774 313/504 |
| 9,028,716 | B2 * | 5/2015 | Winkler | C09K 11/7734 252/301.4 F |
| 9,887,326 | B2 | 2/2018 | Wang et al. | |
| 2004/0119400 | A1 | 6/2004 | Takahashi et al. | |
| 2006/0158109 | A1 | 7/2006 | Takahashi et al. | |
| 2008/0003694 | A1 * | 1/2008 | Swanson | G01N 33/551 436/501 |

(Continued)

FOREIGN PATENT DOCUMENTS

| | | | |
|---|---|---|---|
| CN | 1500367 | A | 5/2004 |
| CN | 105238404 | * | 1/2016 |

(Continued)

OTHER PUBLICATIONS

Translation for CN 105238404, Jan. 13, 2016.*
(Continued)

*Primary Examiner* — C Melissa Koslow
(74) *Attorney, Agent, or Firm* — Fenwick & West LLP

(57) ABSTRACT

An inorganic composite luminescent material includes inorganic illuminants. An inorganic illuminant includes an inorganic luminescent particle configured to emit light, and a porous coating surrounding the inorganic luminescent particle. The porous coating has a plurality of pores. The inorganic composite luminescent material can further include scattering agents within at least a portion of the plurality of pores in the porous coating of the inorganic illuminants. The scattering agents are configured to scatter the light emitted from the inorganic luminescent particles.

19 Claims, 12 Drawing Sheets

(51) Int. Cl.
  *H01L 33/56* (2010.01)
  *H01L 51/50* (2006.01)
  *F21V 8/00* (2006.01)
  *C09K 11/02* (2006.01)
  *C09K 11/70* (2006.01)
  *B82Y 40/00* (2011.01)
  *B82Y 20/00* (2011.01)
  *G02F 1/1335* (2006.01)

(52) U.S. Cl.
  CPC ...... *G02B 6/0011* (2013.01); *G02F 1/133603* (2013.01); *H01L 33/502* (2013.01); *H01L 33/56* (2013.01); *H01L 51/502* (2013.01); *B82Y 20/00* (2013.01); *B82Y 40/00* (2013.01); *G02F 1/133614* (2021.01); *H01L 2933/0091* (2013.01)

(56) References Cited

U.S. PATENT DOCUMENTS

2017/0172932 A1\* 6/2017 Peyman ................. A61K 48/00
2017/0271562 A1 9/2017 Wang et al.

FOREIGN PATENT DOCUMENTS

| CN | 105733556 A | 7/2016 |
| KR | 10-2014-0026794 A | 3/2014 |
| KR | 10-2016-0001568 A | 1/2016 |

OTHER PUBLICATIONS

China National Intellectual Property Administration, Office Action, CN Patent Application No. 201811095064.9, dated Nov. 18, 2020, 15 pages.

\* cited by examiner

INORGANIC COMPOSITE LUMINESCENT MATERIAL, LIGHT-EMITTING FILM, LIGHT-EMITTING DIODE PACKAGE, LIGHT EMITTING DIODE AND LIGHT-EMITTING DEVICE INCLUDING THE SAME

CROSS-REFERENCE TO RELATED APPLICATIONS

This application claims the benefit under 35 U.S.C. § 119(a) Republic of Korea Patent Application No. 10-2017-0120435, filed in Republic of Korea on Sep. 19, 2017, which is incorporated herein by reference in its entirety.

BACKGROUND

Related Field

The present disclosure relates to a luminescent material, and more particularly, to an inorganic composite luminescent material having improved luminous efficiency and an improved scattering characteristic, and a light-emitting film, a light-emitting diode (LED) package, an LED and a light-emitting device, which include the inorganic composite luminescent material.

Discussion of the Related Art

As the information age progresses, a field of displays for processing and displaying a large quantity of information is rapidly developing. Accordingly, various flat panel display devices such as a liquid crystal display (LCD) device, an organic light-emitting diode (OLED) display device, etc. have been developed and are in the spotlight.

Among these display devices, an LCD includes a liquid crystal panel consisting of a liquid crystal layer interposed between two substrates, and when a voltage is applied to the liquid crystal panel, an electric field is generated in the liquid crystal layer, alignment directions of liquid crystal molecules constituting the liquid crystal layer are changed due to the electric field, thereby display images. Since the liquid crystal panel cannot emit light by itself, the use of an external backlight unit serving as a light source is essential. The backlight unit requires a light source emitting light, a light guide plate converting the light emitted from the light source into a surface light source and various types of diffusing films. Recently, as a light source emitting light, an LED is widely used.

Particularly, it is necessary for LCDs including a color filter to realize white light. To this end, white light may be realized using a combination of blue light emitted from an LED chip constituting a LED, and yellow light emitted after a part of blue light is absorbed and excited. As a phosphor absorbing a part of blue light, a YAG phosphor has been used, but due to the limitation of the YAG phosphor in color reproduction, the yellow phosphor has been replaced with quantum dots (QDs) in recent years.

However, when the LCD is driven, due to a large amount of heat generated in the LED chip, the QD is easily degraded, and thus there is a limitation to realize sufficient luminescence characteristics. In addition, since the light emitted from the LED chip is not sufficiently scattered in the QD, the luminance decreases, and thus it is difficult to sufficiently generate white light without using a great amount of high-priced QDs.

In contrast, when more QDs are used, one QD is very closely arranged to an adjacent QD, and therefore, due to a fluorescence resonance energy transfer (FRET) phenomenon, energy is transferred to the adjacent QD, and the quantum efficiency is degraded, resulting in insufficient luminous efficiency.

SUMMARY

Accordingly, the present disclosure is directed to an inorganic composite luminescent materials, and a light-emitting apparatus such as a light-emitting film, an LED chip, an LED or a display device including the material that obviate one or more of the problems due to limitations and disadvantages of the related art.

An object of the present disclosure is to provide an inorganic composite luminescent material having an excellent scattering characteristic, and a light-emitting apparatus such as a light-emitting film, an LED chip, an LED or a light emitting device, which uses the inorganic composite luminescent material.

Another object of the present disclosure is to provide an inorganic composite luminescent material having excellent quantum efficiency and improved luminous efficiency, and a light-emitting apparatus such as a light-emitting film, an LED chip, an LED or a light-emitting device, which uses the inorganic composite luminescent material.

According to an aspect of the present disclosure, the present disclosure provides an inorganic composite luminescent material, which includes: an inorganic illuminant including a porous coating which surrounds a surface of an inorganic luminescent particle; and a scattering agent which can penetrate into pores of the porous coating.

According to another aspect of the present disclosure, the present disclosure provides a light-emitting film, an LED package, and an LCD including the light-emitting film and/or the LED package, each of which includes the inorganic composite luminescent material.

According to still another aspect of the present disclosure, the present disclosure provides an inorganic LED in which the inorganic composite luminescent material is included in an emitting material layer, and an inorganic light-emitting device including the inorganic LED.

Embodiments also relate to an inorganic composite luminescent material including inorganic illuminants. An inorganic illuminant includes an inorganic luminescent particle configured to emit light, and a porous coating surrounding the inorganic luminescent particle. The porous coating has a plurality of pores. In one embodiment, the inorganic composite luminescent material further includes scattering agents within at least a portion of the plurality of pores in the porous coating of the inorganic illuminants. The scattering agents are configured to scatter the light emitted from the inorganic luminescent particles.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Hereinafter, the present disclosure will be described with reference to the accompanying drawings when needed.
[Composite Inorganic Luminescent Material]

Figure 1:
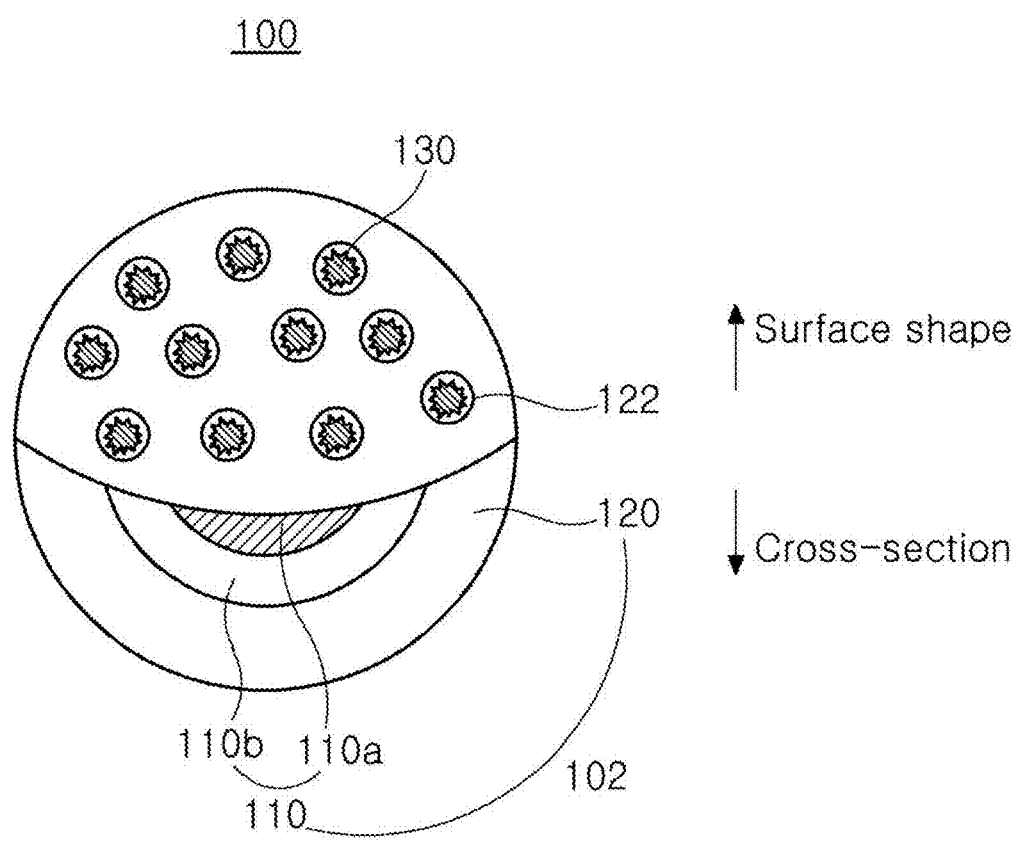
FIG. 1 is a schematic diagram of the structure of an inorganic composite luminescent material according to an embodiment of the present disclosure. The upper part of FIG. 1 illustrates the structure of the surface of the inorganic composite luminescent material, which includes scattering agent disposed in a porous surface of the material, and the lower part of FIG. 1 shows the cross-section of an inorganic illuminant constituting the inorganic composite luminescent material.

FIG. 1 is a schematic diagram of the structure of an inorganic composite luminescent material prepared according to an exemplary embodiment of the present disclosure. As shown in FIG. 1, the inorganic composite luminescent material 100 includes an inorganic illuminant 102 including a porous coating 120 that surrounds the surface of an inorganic luminescent particle 110, and scattering agent 130 that can penetrate into pores 122 of the porous coating 120, which provides the outmost surface of the inorganic illuminant 102.

In the inorganic composite luminescent material 100 according to the present disclosure, the inorganic luminescent particle 110 substantially realizing luminescence may be a nanophosphor or a quantum-sized luminescent particle such as a quantum dot (QD) or quantum rod (QR). As an example, when such an inorganic luminescent particle 110 is irradiated with primary light emitted from a light source, electrons go from a ground state to an excited state, and when electrons go from the excited state to the ground state, photons are emitted, and thus the inorganic luminescent particle 110 emits light with a different wavelength, which is secondary light. Alternatively, the inorganic luminescent particle 110 may emit light in a certain wavelength by the formation of excitons excited by holes and electrons generated from two electrodes disposed opposite each other in an LED, respectively.

As the inorganic luminescent particle 110, a red phosphor, a green phosphor and/or a yellow phosphor may be used. For example, the red phosphor may be silicon-based, nitride-based, sulfide-based, or a combination thereof. In one exemplary embodiment, the red phosphor may be a phosphor having an electroluminescence peak at a wavelength ranging from 600 to 660 nm, that is, it may be a phosphor having a peak wavelength in this range, and the green phosphor or yellow phosphor may be a phosphor having a peak wavelength ranging from 530 to 560 nm. For example, the red phosphor may be selected form the group consisting of $K_2SiF_6:Mn^{4+}$ (KSF), $K_2TiF_6:Mn^{4+}$ (KTF), $Ca_2Si_5N_8:Eu^{2+}$, $Sr_2Si_5N_8:Eu^{2+}$, $Ba_2Si_5N_8:Eu^{2+}$, $CaAlSiN_3:Eu^{2+}$, $SrS:Eu^{2+}$, $CaS:Eu^{2+}$ and a combination thereof. The green phosphor may be a material selected from the group consisting of $SiAlON:Eu^{2+}$, $SrSi_2O_2N_2:Eu^{2+}$ and a combination thereof, and the yellow phosphor may be a material such as $Y_3Al_5O_{12}:Ce^{3+}$ (YAG).

In an alternative exemplary embodiment, the inorganic luminescent particle 110 may be an inorganic light-emitting nanoparticle such as QD or QR. The QD or QR is an inorganic particle which emits light when the energy level of instable electrons falls down from a conduction band to a valence band. Such an inorganic light-emitting nanoparticle has a very high extinction coefficient and an excellent quantum yield for organic particles, and thus emits intense fluorescence. In addition, since an emission wavelength is changed according to the size of the inorganic light-emitting nanoparticle, it may be possible to realize a variety of colors by obtaining light of a whole range of visible light by adjusting the size of the inorganic luminescent particle.

In one exemplary embodiment, the QD or QR may have a single structure. In another exemplary embodiment, the QD or QR may have a heterologous structure including a core 110a emitting light in its center and a shell 110b covering the surface of the core 110a to protect it, and a ligand component may be configured to surround the surface of the shell 110b to disperse the QD or QR in a solvent. Here, the shell 110b may be formed as a single shell or multiple shells. The degree of the growth and the crystal structure of the inorganic luminescent particle may be adjusted according to the reactivity and injection rate of a reaction precursor(s) constituting the core 110a and/or the shell 110b, the type of ligand, and a reaction temperature, and therefore, it is possible to induce the emission of light of various wavelength ranges by adjusting an energy bandgap.

As an example, the QD or QR has a type I core/shell structure in which the energy bandgap of the component of the core 110a is surrounded by the energy bandgap of the shell 110b, and electrons and holes are transferred to the core 110a and recombined in the core 110a, which is a illuminant, thereby emitting energy as light.

When the QD or QR has a type-I core 110a/shell 110b structure, i.e. type-I core 110a and shell 110b structure, the core 110a is a region in which luminescence substantially occurs, and an emission wavelength of the QD or QR is determined according to the size of the core 110a. To achieve a quantum confinement effect, the core 110a necessarily has a smaller size than the exciton Bohr radius according to the material of the QD or QR, and an optical bandgap at a corresponding size.

Meanwhile, the shell 110b constituting the QD or QR promotes the quantum confinement effect of the core 110a, and determines the QD or QR stability. Atoms exposed on the surface of colloidal QD or QR having a single structure have lone pair electrons, which do not participate in a chemical bond, different from internal atoms. Since energy levels of these surficial atoms are between the conduction band edge and the valence band edge of the QD or QR, the atoms can trap charges, thereby forming surface defects. Due to a non-radiative recombination process of excitons caused by the surface defects, the luminous efficiency of QD or QR may be degraded, and the trapped charges may react with external oxygen and compounds, leading to a change in the chemical composition of the QD or QR, or permanent loss of the electrical/optical properties of the QD or QR.

To effectively form the shell 110b on the surface of the core 110a, a lattice constant of the material constituting the shell 110b needs to be similar to that of the material constituting the core 110a. As the surface of the core 110a is surrounded by the shell 110b, the oxidation of the core 110a may be prevented, the chemical stability of the QD or QR may be enhanced, and the photo-degradation of the core 110a by an external factor such as water or oxygen may be prevented. In addition, the loss of excitons caused by the surface trap on the surface of the core 110a may be minimized, and the energy loss caused by molecular vibration may be prevented, thereby enhancing the quantum efficiency.

The QD or QR may be a semiconductor nanocrystal or metal oxide particle, which has a quantum confinement effect. For example, the QD or QR may be a Group II-VI, III-V, IV-VI or I-III-VI nano-semiconductor compound. More specifically, the core 110a and/or shell 110b constituting the QD or QR may be Group II-VI compound semiconductor nanocrystals such as CdS, CdSe, CdTe, ZnS, ZnSe, ZnTe, HgS, HgTe and/or a combination thereof; Group III-V compound semiconductor nanocrystals such as GaP, GaAs, GaSb, InP, InAs, InSb and/or a combination thereof; Group IV-VI compound semiconductor nanocrystals such as PbS, PbSe, PbTe and/or a combination thereof; Group I-III-VI compound semiconductor nanocrystals such as $AgGaS_2$, $AgGaSe_2$, $AgGaTe_2$, $CuInS_2$, $CuInSe_2$, $CuGaS_2$ and/or a combination thereof; metal oxide nanoparticles such as ZnO, $TiO_2$ and/or a combination thereof; or core-shell structured nanocrystals such as CdSe/ZnSe, CdSe/ZnS, CdS/ZnSe, CdS/ZnS, ZnSe/ZnS, InP/ZnSZnO/MgO (left of the first square indicates the core component and right of the first square indicates the shell component) and/or an arbitrary combination thereof. The semiconductor nanoparticle may be doped with a rare earth element such as Eu, Er, Tb, Tm or Dy or an arbitrary combination thereof or not doped, or may be doped with a transition metal element such as Mn, Cu, Ag or Al or an arbitrary combination thereof.

As an example, the core 110a constituting the QD or QR may be selected from the group consisting of ZnSe, ZnTe, CdSe, CdTe, InP, ZnCdS, $Cu_xIn_{1-x}S$, $Cu_xIn_{1-x}Se$, $Ag_xIn_{1-x}S$ and a combination thereof. In addition, the shell 110b constituting the QD or QR may be selected from the group consisting of ZnS, GaP, CdS, ZnSe, CdS/ZnS, ZnSe/ZnS, ZnS/ZnSe/CdSe, GaP/ZnS, CdS/CdZnS/ZnS, ZnS/CdSZnS, $Cd_xZn_{1-x}S$ and a combination thereof.

Meanwhile, the QD may be an alloy QD (e.g., $CdS_xSe_{1-x}$, $CdSe_xTe_{1-x}$, or $Zn_xCd_{1-x}Se$) such as a homogeneous alloy QD or a gradient alloy QD.

The porous coating 120 constituting the inorganic illuminant 102 surrounds at least a part of the surface of the above-described inorganic luminescent particle 110. The term "coating" used herein may be interchangeably used with "second shell," or to distinguish it from a "capsule." The pores may be a plurality of openings on the surface of the porous coating 120. The pores may have various shapes. For example, the pores may have curved shapes, such as circular shapes or elliptical shapes, but is not limited hereto. The size of a pore may be measured by its diameter that indicates a length along an axis of the pore from one edge of the opening to another edge of the opening. In some measurement techniques, the size of the pore may be determined by modeling the pore as a circular cross-section, and determining the diameter of the circular cross-section as the size of the pore.

As an example, the porous coating 120 may be formed of any one material selected from the group consisting of silica ($SiO_2$), titania ($TiO_2$), alumina ($Al_2O_3$), zirconia ($ZrO_2$), zinc oxide (ZnO), niobium, zirconium, cerium, silicate and/or a combination thereof, but the present disclosure is not limited thereto.

In one exemplary embodiment, the porous coating 120 may be a microporous coating, a mesoporous coating, and/or a macroporous coating. The microporous coating used herein refers to a porous coating having pores 122 with an average diameter of less than 2 nm, the mesoporous coating refers to a porous coating having pores 122 with an average diameter of 2 nm or more and less than 50 nm, and the macroporous coating refers to a porous coating having pores 122 with an average diameter of 50 nm or more. In one exemplary embodiment, the porous coating 120 may have a mesoporous pore 122, but the present disclosure is not limited thereto.

In one exemplary embodiment, the porous coating 120 may be applied to coprecipitation, hydrothermal synthesis, self-assembly, casting, anodic oxidation, electrochemical etching, a sol-gel method or coordination chemistry, and may be formed to cover the surface of the inorganic luminescent particle 110 using a method of adding a precursor of the porous coating 120 and a pore-forming agent.

As an example, an inorganic illuminant 102 covering the surface of the inorganic luminescent particle 110 with the porous silica coating 120 may be formed by a three-step process of forming a silica oligomer by hydrolyzing alkoxy silane when a silica precursor (e.g., tetraethoxy orthosilicate; TEOS) is added to a solution in which an inorganic illuminant and a pore-forming agent are dispersed to obtain porous silica, forming a primary particle of silica/pore-forming agent, and growing a mesopore, which is a suitable size of pore due to agglomeration of the primary particle.

In this case, as the pore-forming agent used to form the porous coating 120 on the surface of the inorganic luminescent particle 110, any pore-forming agent that can be used to form a porous surface may be used. For example, the pore-forming agent may be a cationic surfactant, for example, an alkylammonium salt, an alkylpyridinium salt, an alkylimidazolinium salt, a quaternary ammonium salt and/or a primary, secondary or tertiary aliphatic amine salt. Specifically, the pore-forming agent may be cetyltrimethylammonium brominde (CTAB), tetradecyltrimethylammonium bromide (TTAB), cetyltrimethylammonium chloride (CTAC), hexadecyltrimethylammonium bromide (HTAB), N-dodecyl pyridinium chloride, and/or benzalkonium chloride (alkyldimethyl benzylammonium chloride).

The inorganic illuminant 102 includes a porous coating 120 covering the surface of the inorganic luminescent particle 110. Due to the porous coating 120, the inorganic luminescent particle 110 substantially realizing luminescence may not approach close to another luminescent particle within a specific distance. In the case of a conventional illuminant consisting only of the inorganic luminescent particle 110, an inorganic luminescent particle (donor) approaches close to an adjacent inorganic luminescent particle (acceptor) within a specific distance, leading to absorption of light emitted from the donor inorganic luminescent particle to the acceptor inorganic luminescent particle. Accordingly, energy emitted from the donor inorganic luminescent particle is not emitted as luminescence by the donor inorganic luminescent particle but is consumed to excite the adjacent the acceptor inorganic luminescent particle and induce fluorescence, and thus a fluorescence resonance energy transfer (Forster Resonance Energy Transfer; FRET) phenomenon occurs. Therefore, the quantum efficiency or luminous efficiency is degraded.

However, since the inorganic illuminant 102 according to the present disclosure has the porous coating 120 surrounding the surface of the inorganic luminescent particle 110, an inorganic luminescent particle and an adjacent inorganic luminescent particle, which substantially participate in realization of luminescence, may not be disposed sufficiently close to each other to cause the FRET phenomenon. As described above, by using the inorganic illuminant 102 according to the present disclosure, the FRET phenomenon may be prevented, and therefore, desired quantum efficiency or luminous efficiency may be achieved. To this end, a thickness of the porous coating 120 may be, for example, 5 to 100 nm, but the present disclosure is not limited thereto.

Meanwhile, the inorganic composite luminescent material 100 according to the present disclosure includes the scattering agent 130 capable of penetrating into the pores 122 formed in the porous coating 120 forming the outermost surface of the above-described inorganic illuminant 102. Thus, the inorganic composite luminescent material 100 may include scattering agents 130 within at least of a portion of the plurality of pores 122 of the porous coating 120. The scattering agents 130 may scatter light emitted from the inorganic luminescent particle 110. Due to the scattering agent 130 capable of penetrating into the pores 122, secondary light emitted from the inorganic illuminant 102 may be effectively scattered toward the outside.

In one exemplary embodiment, the scattering agent 130 may include inorganic scattering agent selected from the group consisting of silicone, silica ($SiO_2$), alumina ($Al_2O_3$), titania ($TiO_2$), zirconia ($ZrO_2$), barium sulfate ($BaSO_4$), zinc oxide (ZnO), magnesium fluoride (MgF) and a combination thereof. In another exemplary embodiment, the scattering agent 130 may be in the form of organic beads formed of one selected from the group consisting of acrylic (e.g., polymethylmethacrylate-based) resins, styrene-based resins, urethane-based resins, melanin-based resins, benzoguanamine-based resins, epoxy-based resins, silicone-based resins and a combination thereof.

Figure 2:
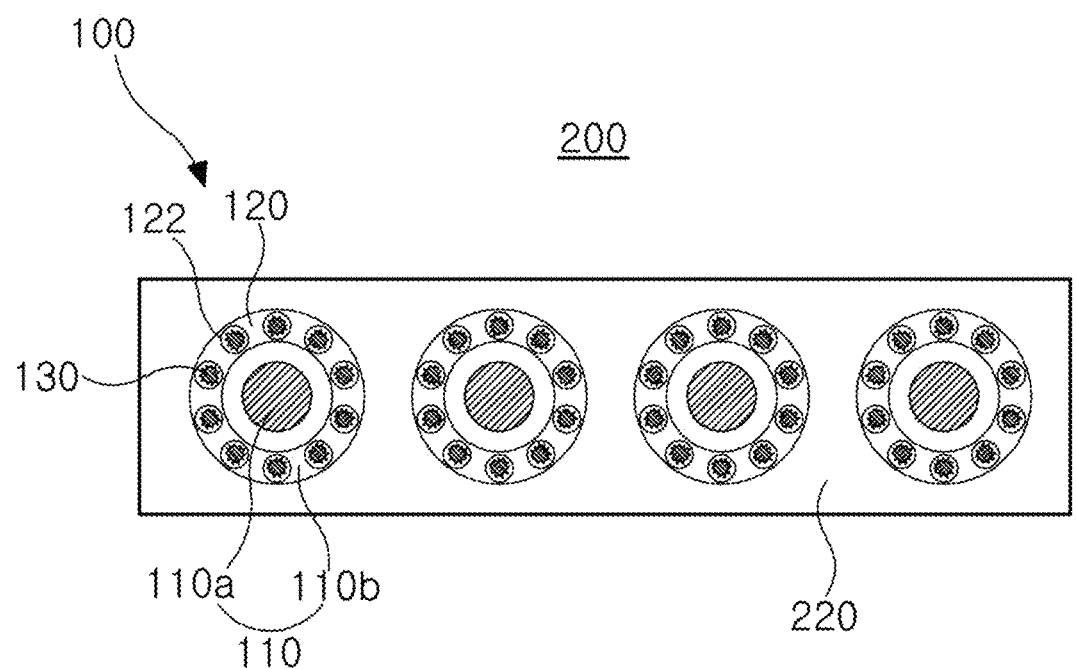
FIG. 2 is a cross-sectional view schematically illustrating the structure of a light-emitting film according to an exemplary embodiment of the present disclosure, which includes inorganic composite luminescent materials.
Figure 6:
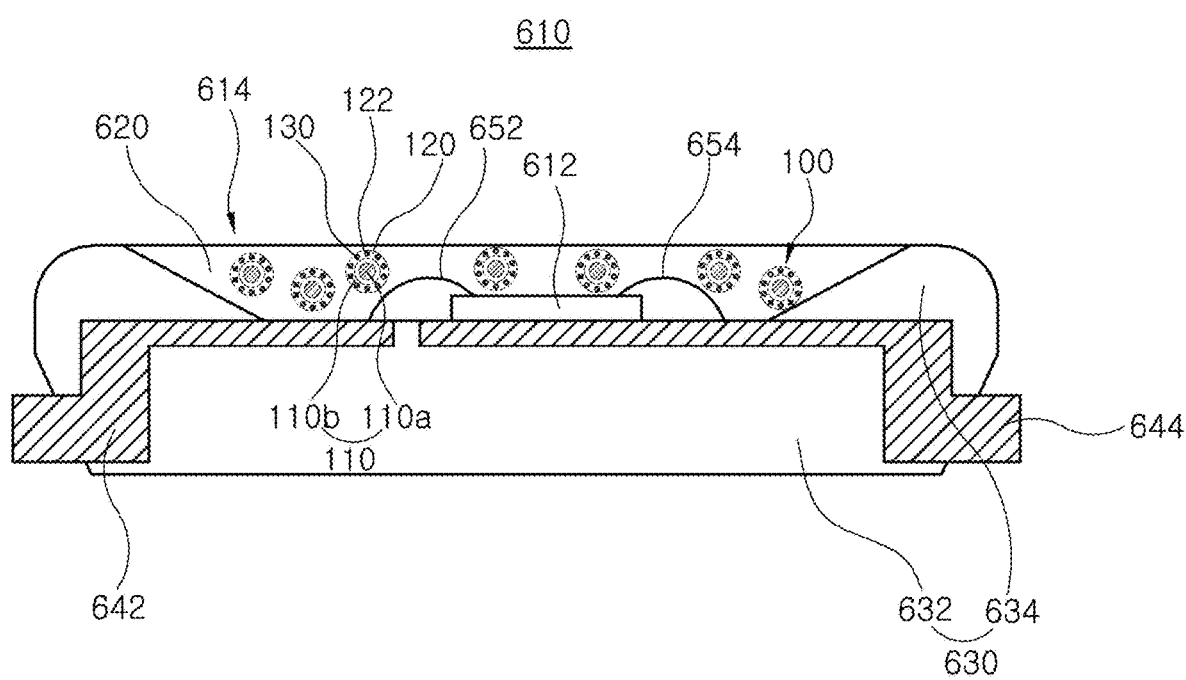
FIG. 6 is a cross-sectional view schematically illustrating an LED package according to an exemplary embodiment of the present disclosure, in which an inorganic composite luminescent material is applied to an encapsulation material.

Here, to maximize the scattering effect of the secondary light emitted from the inorganic illuminant 102, it is preferable that the scattering matter 130 has a refractive index lower than that of the inorganic luminescent particle 110, but may be higher than that of a matrix resin (220, see FIG. 2; 620, see FIG. 6). Since the secondary light emitted from the inorganic luminescent particle 110 having the highest refractive index is transferred to the scattering agent 130 having an intermediate refractive index and then to the matrix resin having the lowest refractive index, reflectivity resulting from a difference in refractive indexes is reduced. Therefore, an amount of light transmitted and scattered to the outside may be maximized, and thereby luminance and luminescence characteristics may be enhanced.

The scattering agent 130 preferably has a suitable size to penetrate into at least a portion of a plurality of the pores 122 formed on the surface of the porous coating 120. For example, the size of the scattering agent 130 may be less than a threshold percentage of the size of the pores 122. The scattering agent 130 which fails to penetrate into the pores 122 may agglomerate with one another in a dispersion solvent, and thus a desired scattering effect may not be induced.

In addition, in the inorganic composite luminescent material 100 according to the present disclosure, the scattering agent 130 is preferably added at 1 to 30 parts by weight with respect to 100 parts by weight of the inorganic illuminant 102. When the contents of the scattering agent 130 is less than 1 part by weight with respect to 100 parts by weight of the inorganic illuminant 102, it is difficult to expect an enhanced scattering effect. On the other hand, even though the contents of the scattering agent 130 is more than 30 parts by weight, a scattering effect may not be enhanced, but rather decrease due to the agglomeration of the scattering agent 130 with one another.

The inorganic composite luminescent material 100 according to the present disclosure has the inorganic illuminant 102 having the porous coating 120 with a predetermined thickness, formed on the surface of the inorganic luminescent particle 110. Since the inorganic luminescent particle 110 may not approach close to another within a specific distance, the degradation of luminous efficiency caused by the FRET phenomenon may be prevented. The distances between inorganic luminescent particles 110 may be greater than a thickness of the porous coating 120. In addition, as the scattering agent 130 that can penetrate into at least a portion of a plurality of the pores 122 are disposed on the surface of the porous coating 120, the secondary light emitted from the inorganic illuminant 102 is effectively scattered, the luminance may be improved. In addition, with different types of the inorganic luminescent particles 110, light of various wavelength bands may be emitted, thereby realizing a variety of colors.

[Light Emitting Film, LED Package and Display Device]

As described above, the inorganic composite luminescent material according to the present disclosure may realize excellent luminous efficiency and a variety of colors, and photo-degradation or a FRET phenomenon may be prevented. The inorganic composite luminescent material according to the present disclosure may be applied to a display device requiring luminescence, and in this embodiment, a light-emitting film, an LED package and a display device, which include the inorganic composite luminescent material, will be described.

FIG. 2 is a cross-sectional view schematically illustrating the structure of a light-emitting film according to an exemplary embodiment of the present disclosure. As shown in FIG. 2, the light-emitting film 200 may include an inorganic composite luminescent material 100, each including an inorganic illuminant 102 (see FIG. 1) having a porous coating 120 surrounding the inorganic luminescent particle 110 and scattering agent 130 capable of penetrating into at least a portion of a plurality of pores 122 formed in the porous coating 120, and a matrix resin 220 in which the inorganic composite luminescent material 100 is dispersed. The matrix resin 220 in which the inorganic composite luminescent material 100 is dispersed according to the present disclosure may consist of a polymer material having excellent thermal resistance, such as an epoxy-based resin, a silicone-based resin and/or a polyimide-based resin, but the present disclosure is not limited thereto.

As an example, the inorganic luminescent particle 110 may be a phosphor, a QD or a QR, and when the inorganic luminescent particle 110 is a QD or a QR, it may be formed in a heterologous structure of a core 110a and a shell 110b. As a component and a size of the core 110a constituting the inorganic luminescent particle 110 are adjusted, a variety of colors may be easily realized, and as the core 110a is protected by the shell 110b, a trap energy level may be reduced. In addition, since the porous coating 120 with a predetermined thickness is formed around the inorganic luminescent particle 110, a distance between adjacent inorganic luminescent particles 110 is increased, and thus the FRET phenomenon which may occur between adjacent inorganic luminescent particles 110 may be minimized.

Moreover, the scattering agent 130 penetrates into the pores 122 formed in the porous coating 120, which constitutes the outermost surface of the inorganic illuminant. In this case, the scattering matter 130 may have a refractive index lower than that of the inorganic luminescent particle 110 emitting secondary light but higher than that of the matrix resin 220. When the inorganic luminescent particles 110 are simply dispersed in the matrix resin 220, since the refractive index of the inorganic luminescent particle 110 is much higher than that of the matrix resin 220, considerable portions of the secondary light emitted from the inorganic luminescent particle 110 may be totally reflected, without being transmitted or diffused to the outside. Accordingly, the luminance and luminous efficiency of the light-emitting film may be degraded.

In contrast, according to the present disclosure, when the inorganic composite luminescent material 100 in which the scattering agent 130 having a higher refractive index than that of a matrix resin 220 are disposed around the inorganic luminescent particle 110 is used, a difference in refractive index between the inorganic luminescent particle 110 and the scattering matter 130 and a difference in refractive index between the scattering matter 130 and the matrix resin 220 are much smaller than a difference in refractive index between the inorganic luminescent particle 110 and the matrix resin 220. Therefore, among the secondary light emitted from the inorganic luminescent particles 110, the amount of the secondary light totally reflected may be reduced, and most of the secondary light emitted from the inorganic luminescent particles 110 is transmitted and scattered to the outside, thereby enhancing luminance and luminous efficiency.

Figure 3:
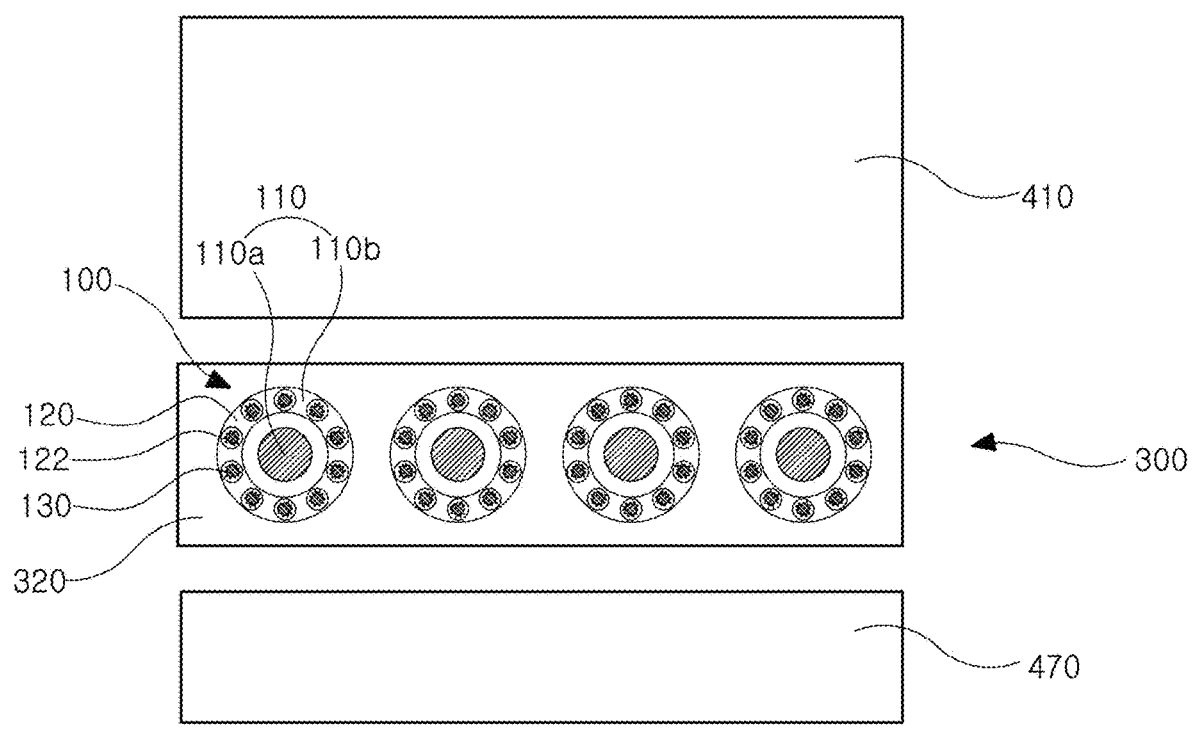
FIG. 3 is a cross-sectional view schematically illustrating a display device according to an exemplary embodiment of the present disclosure, which includes an inorganic composite luminescent material-applied light-emitting film.

Hereinafter, a display device to which the light-emitting film according to the present disclosure is applied will be described. FIG. 3 is a cross-sectional view schematically illustrating an LCD including the light-emitting film according to an exemplary embodiment of the present disclosure, and FIG. 4 is a cross-sectional view schematically illustrating a liquid crystal panel of FIG. 3.

As shown in FIG. 3, an LCD device 400 according to an exemplary embodiment of the present disclosure includes a liquid crystal panel 410, a backlight unit 470 disposed under the liquid crystal panel 410, and a light-emitting film 300 disposed between the liquid crystal panel 410 and the backlight unit 470.

Figure 4:
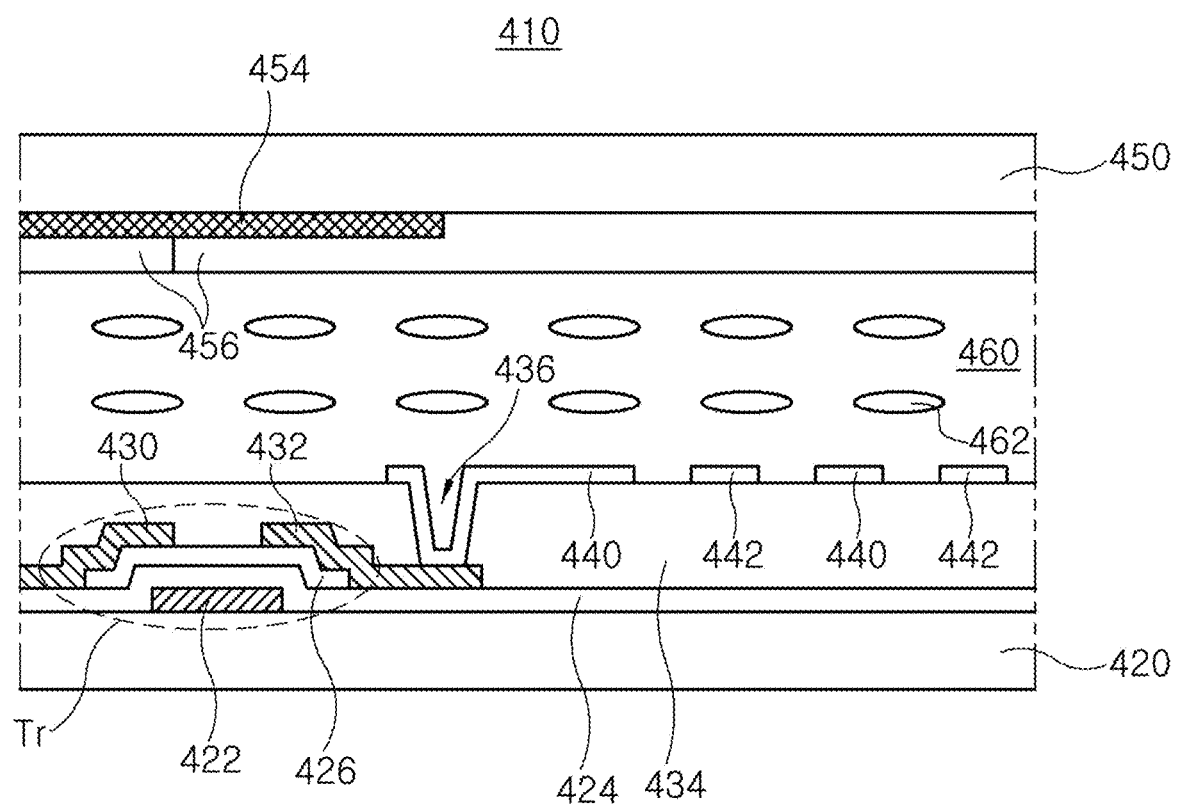
FIG. 4 is a cross-sectional view schematically illustrating a display panel constituting the display device according to an exemplary embodiment of the present disclosure.

As shown in FIG. 4, the liquid crystal panel 410 includes first and second substrates 420 and 450, and a liquid crystal layer 460 interposed between the first and second substrates 420 and 450 and including liquid crystal molecules 462.

A gate electrode 422 is formed on the first substrate 420, and a gate insulating film 424 is formed to cover the gate electrode 422. In addition, a gate line (not shown) connected to the gate electrode 422 is formed on the first substrate 420.

On the gate insulating film 424, a semiconductor layer 426 is formed to correspond to the gate electrode 422. The semiconductor layer 426 may consist of an oxide semiconductor material. However, the semiconductor layer 426 may include an active layer consisting of amorphous silicon and an ohmic contact layer consisting of amorphous silicon with impurities.

On the semiconductor layer 426, a source electrode 430 and a drain electrode 432 are formed to be spaced apart from each other. In addition, a data line (not shown) connected to the source electrode 430 intersects with the gate line to define a pixel area. The gate electrode 422, the semiconductor layer 426, the source electrode 430 and the drain electrode 432 constitute a thin film transistor Tr.

On the thin film transistor Tr, a passivation layer 434 having a drain contact hole 436 exposing the drain electrode 432 is formed. On the passivation layer 434, a pixel electrode 440, which is a first electrode connected to the drain electrode 432 by a drain contact hole 436, and a common electrode 442, which is a second electrode alternately arranged with a pixel electrode 440, are formed.

Meanwhile, a black matrix 454 covering a non-illustrated region which includes the thin film transistor Tr, the gate line, the data line, etc. is formed on the second substrate 450. In addition, color filter layers 456 are formed to correspond to pixel areas.

The first and second substrates 420 and 450 are combined to have the liquid crystal layer 460 disposed between them, and the liquid crystal molecules 462 of the liquid crystal layer 460 are driven by an electric field generated between the pixel electrode 440 and the common electrode 442. Although not shown in FIG. 4, an alignment layer may be formed in contact with the liquid crystal layer 460 on each of the first and second substrates 420 and 450, and polarizers having transmission axes perpendicular to each other may be attached to the outer surfaces of the first and second substrates 420 and 450, respectively.

Referring back to FIG. 3, the backlight unit 470 includes a light source (not shown) and provides light to the liquid crystal panel 410. The backlight unit 470 may be classified into a direct type and a side type according to the position of a light source.

When the backlight unit 470 is of a direct type, the backlight unit may include a bottom frame (not shown) covering the lower part of the liquid crystal panel 410, and a plurality of light sources may be arranged on a horizontal surface of the bottom frame. Meanwhile, when the backlight unit 470 is of a side type, the backlight unit 470 may include a bottom frame (not shown) covering the lower part of the liquid crystal panel 410, a light guide plate (not shown) may be disposed on the horizontal surface of the bottom frame, and light sources may be disposed on at least one part of the light guide plate. Here, the light source may emit light at a wavelength range of blue light, for example, within a wavelength ranging from approximately 430 to 470 nm.

The light-emitting film 300 may be disposed between the liquid crystal panel 410 and the backlight unit 470, and enhance a color purity of light provided by the backlight unit 470. For example, the light-emitting film 300 may include inorganic composite luminescent materials 100, and a matrix resin 320 in which the inorganic composite luminescent material 100 is dispersed. The inorganic composite luminescent material 100 includes an inorganic illuminant 102 (see FIG. 1) having a porous coating 120 surrounding the inorganic luminescent particle 110, which may be a phosphor, a QD or QR, and scattering agent 130 capable of penetrating into at least a portion of a plurality of pores 122 formed in the porous coating 120. As an example, the inorganic luminescent particle 110 may emit light of a wavelength range of red light and green light, but the present disclosure is not limited thereto.

As describe above, the inorganic composite luminescent material 100 according to the present disclosure may emit light in various wavelength bands by using different components of the inorganic luminescent particle 110. Particularly, as the inorganic luminescent particle 110 having the heterologous structure of the core 110a/shell 110b is adopted, the quantum efficiency of the inorganic luminescent particle 110 may be improved more than two times, and photo-degradation may be prevented. In addition, the formation of the porous coating 120 having a predetermined thickness on the outside of the inorganic luminescent particle 110 may prevent the inorganic luminescent particles 110 to be arranged excessively close to each other and thus the FRET phenomenon may be prevented. Moreover, since the scattering agent 130 penetrates into the pores 122 of the porous coating 120 forming the outermost surface of the inorganic illuminant 102 (see FIG. 1), the secondary light emitted from the inorganic luminescent particle 110 is effectively transmitted and scattered toward the outside, thereby enhancing the luminance and luminous efficiency of an LCD device 400 including the light-emitting film 300.

Figure 5:
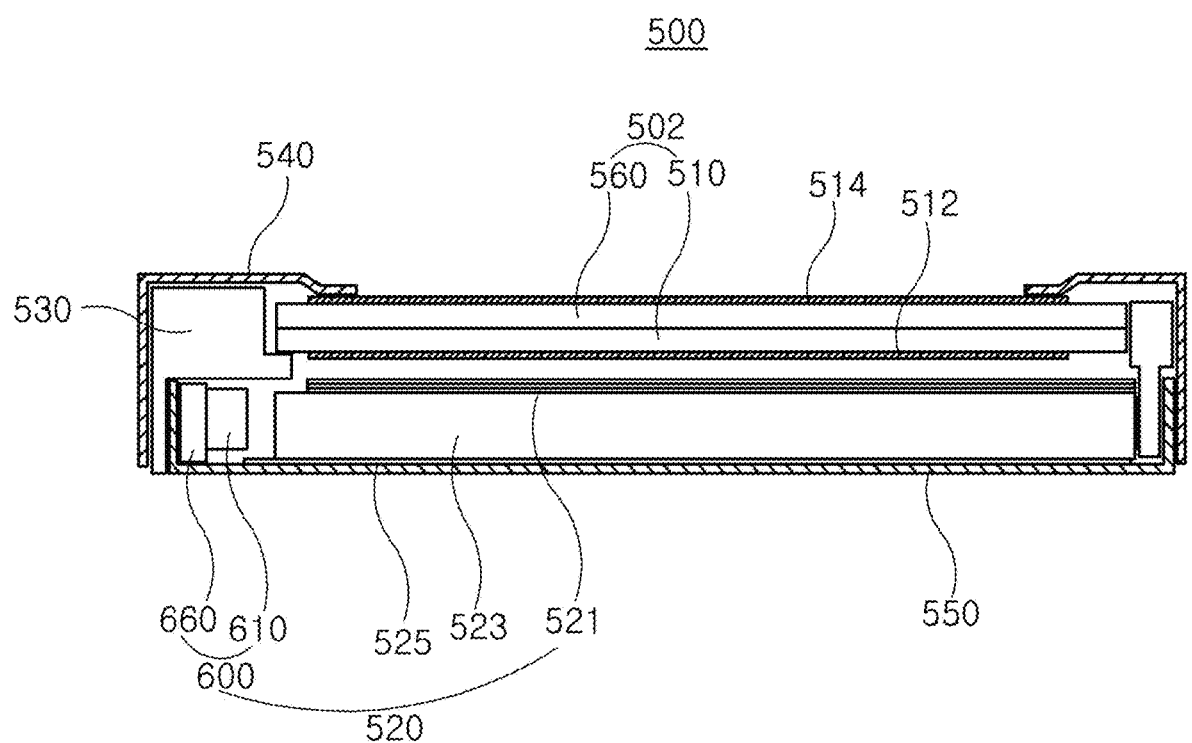
FIG. 5 is a cross-sectional view schematically illustrating a display device according to an exemplary embodiment of the present disclosure.

Hereinafter, an LED package to which the inorganic composite luminescent material is to be applied according to the present disclosure will be described. FIG. 5 is a cross-sectional view schematically illustrating a display device according to an exemplary embodiment of the present disclosure, and FIG. 6 is a cross-sectional view schematically illustrating an LED package according to an exemplary embodiment of the present disclosure.

As shown in FIG. 5, the display device 500 includes a liquid crystal panel 502 as a display panel, a backlight unit 520 under the liquid crystal panel 502. The display device 500 may further include a main frame 530, a top frame 540 and a bottom frame 550 for modularizing the liquid crystal panel 502 and the backlight unit 520. The liquid crystal panel 502 includes first and second substrates 510 and 560 and a liquid crystal layer 460 (of FIG. 4) therebetween. Since the liquid crystal panel 502 may have similar structure as those in FIG. 4, the explanation is omitted. First and second polarization plates 512 and 514 transmitting a predetermined light are attached on an outer surface of the first and second substrates 510 and 560, respectively. A linearly-polarized light being parallel to a direction of a transmissive axis of the first and second polarization plates 512 and 514 passes through the first and second polarization plates 512 and 514. For example, the transmissive axis of the first and second polarization plates 512 and 514 may be perpendicular to each other.

Although not shown, a printed circuit board (PCB) may be connected to at least one side of the liquid crystal panel 502 via a connection member, for example, a flexible PCB or a tape carrier package. The PCB is bent along a side surface of the main frame 530 or a rear surface of the bottom frame 450 during a modularization process of the display device 500.

The backlight unit 520 providing the light is disposed under the liquid crystal panel 502. The backlight unit 520 includes a light emitting diode (LED) assembly 600, a reflective plate 525 of white or silver, a light guide plate 523 on the reflective plate 525 and an optical sheet 521 on the light guide plate 523.

The LED assembly 600 is disposed at a side of the light guide plate 523 and includes a plurality of LED packages 610 and an LED PCB 660. The LED packages 610 are arranged on the LED PCB 660. Each LED package 610 may comprise an LED chip 612 (of FIG. 6) emitting red, green and blue lights or white light such that white light is provided from the LED package 610 toward the light guide plate 523. For example, adjacent three LED packages 610 respectively emit red, green and blue lights, and the lights are mixed to provide the white light. The LED PCB 660 may be a flexible PCB or a metal core PCB.

The light from the LED package 610 is incident into the light guide plate 523. The light travels the light guide plate 523, and a plane light source is provided onto the liquid crystal panel 502 by a total reflection in the light guide plate 523. Patterns for providing uniform plane light may be formed on a rear surface of the light guide plate 523. For example, the patterns of the light guide plate 523 may be an elliptical pattern, a polygonal pattern or a hologram pattern.

The reflective plate 525 is disposed under the light guide plate 523, and the light from the rear side of the light guide plate 523 is reflected by the reflective plate 525 to improve the brightness. The optical sheet 521 on or over the light guide plate 523 may include a light diffusion sheet or at least one light concentration sheet. The LED packages 610 may be arranged in a plurality of lines on the LED PCB 660.

The liquid crystal panel 502 and the backlight unit 520 are modularized by the main frame 530, the top frame 540 and the bottom frame 550. The top frame 540 covers edges of a front surface of the liquid crystal panel 502 and side surfaces of the liquid crystal panel 502. The top frame 540 has an opening such that images from the liquid crystal panel 502 can be displayed through the opening of the top frame 540. The bottom frame 550 includes a bottom surface and four side surfaces to cover a rear surface of the backlight unit 520 and side surfaces of the backlight unit 520. The bottom frame 550 covers a rear side of the backlight unit 520. The main frame 530 has a rectangular frame shape. The main frame 530 covers side surfaces of the liquid crystal panel 502 and the backlight unit 520 and is combined with the top frame 540 and the bottom frame 550.

As shown in FIG. 6, the LED package 610 includes an LED chip 612, and an encapsulation part 614 covering the LED chip 612. The encapsulation part 614 includes an inorganic composite luminescent material 100, as luminescent materials, each including an inorganic illuminant 102 (see FIG. 1) having a porous coating 120 surrounding the outer surface of the inorganic luminescent particle 110, and scattering agent 130 capable of penetrating into at least a portion of a plurality of pores 122 of a porous coating 120, and a matrix resin 620 as an encapsulation resin capable of dispersing the inorganic composite luminescent materials 100. As an example, the inorganic composite luminescent materials 100 may be dispersed in the matrix resin 620 having a good dissipation property such as an epoxy-based resin, a silicone-based resin and/or a polyimide-based resin. The inorganic composite luminescent materials 100 may also include scattering agents 130 within at least a portion of the pores of the porous coating 120 of the inorganic illuminants, where the refractive index of the scattering agents 130 is greater than a refractive index of the matrix resin 620, and where the refractive index of the scattering agents 130 is smaller than a refractive index of the inorganic luminescent particles 110.

Similar to the light-emitting film 200 shown in FIG. 2, the inorganic composite luminescent materials 100 which have the scattering agent 130 having a larger refractive index than that of the matrix resin 620 are disposed on the outer surface of the inorganic luminescent particle 110 may be used. Accordingly, an amount of the totally-reflected secondary light of the light emitted from the inorganic luminescent particles 110 may be reduced, and most of the secondary light emitted from the inorganic luminescent particle 110 is transmitted and scattered to the outside, thereby enhancing luminance and luminous efficiency.

In one exemplary embodiment, the LED package 610 may be a white LED package which can realize white luminescence. One method of realizing white light includes using an LED chip 612 enabling ultraviolet (UV) luminescence as a light source, and combining inorganic composite luminescent materials 100 according to the present disclosure, capable of emitting red (R), green (G) and blue (B) light, in the encapsulation part 614. Another method of realizing white light is using an LED chip 612, for example, emitting blue light, and combining inorganic composite luminescent materials 100 capable of emitting yellow, green and/or red light and absorbing blue light.

For example, the LED chip 612 may be a blue LED chip emitting light of a wavelength range of approximately 430 to 470 nm, and the inorganic luminescent particle 110 constituting the inorganic composite luminescent material 100 may be a phosphor, a QD or QR emitting light of a green wavelength range and/or a red wavelength range. In one exemplary embodiment, the LED chip 612 emitting blue light may use sapphire as a substrate, and a material having a blue peak wavelength may be applied as a light source for excitation. As an example, a material for the blue LED chip may be selected from the group consisting of GaN, InGaN, InGaN/GaN, $BaMgAl_{10}:O_7Eu^{2+}$, $CaMgSi_2O_6:Eu^{2+}$ and a combination thereof, but the present disclosure is not limited thereto.

In this case, the inorganic luminescent particles 110 having a predetermined range of emission wavelengths by intensively absorbing blue light emitted by a blue light-emitting light source may be used. These inorganic luminescent particles 110 may be applied on, for example, the LED chip 612 emitting blue light, thereby overall realizing a white LED.

In addition, the LED package 610 may further include a case 630, and first and second electrode leads 642 and 644 connected to the LED chip 612 via first and second wires 652 and 654 and exposed to the outside of the case 630. The case 630 includes a body 632 and a side wall 634 protruding from the top surface of the body 632 to serve as a reflecting surface, and the LED chip 612 is disposed above the body 632, and surrounded by the side wall 634.

As described above, luminescence in various wavelength ranges may be realized by varying the composition and component of the inorganic luminescent particle 110. As the inorganic luminescent particles 110 having the heterologous structure of the core 110a/shell 110b are employed, the quantum efficiency of the inorganic luminescent particle 110 may be enhanced, and photo-degradation may be inhibited. Due to the porous coating 120 having a predetermined thickness formed on the outside of the inorganic luminescent particle 110, the FRET phenomenon may be prevented. In addition, since the scattering agent 130 is disposed inside the pores 122 formed in the porous coating 120, the scattering characteristic of the secondary light emitted from the inorganic luminescent particle 110 and the luminance characteristic may be improved. Accordingly, a luminance of the LED package 610 including the inorganic composite luminescent materials 100 may increase, and the luminance of an LCD including the LED package 610 is greatly enhanced.

[Inorganic LED and Light-Emitting Device]

Figure 7:
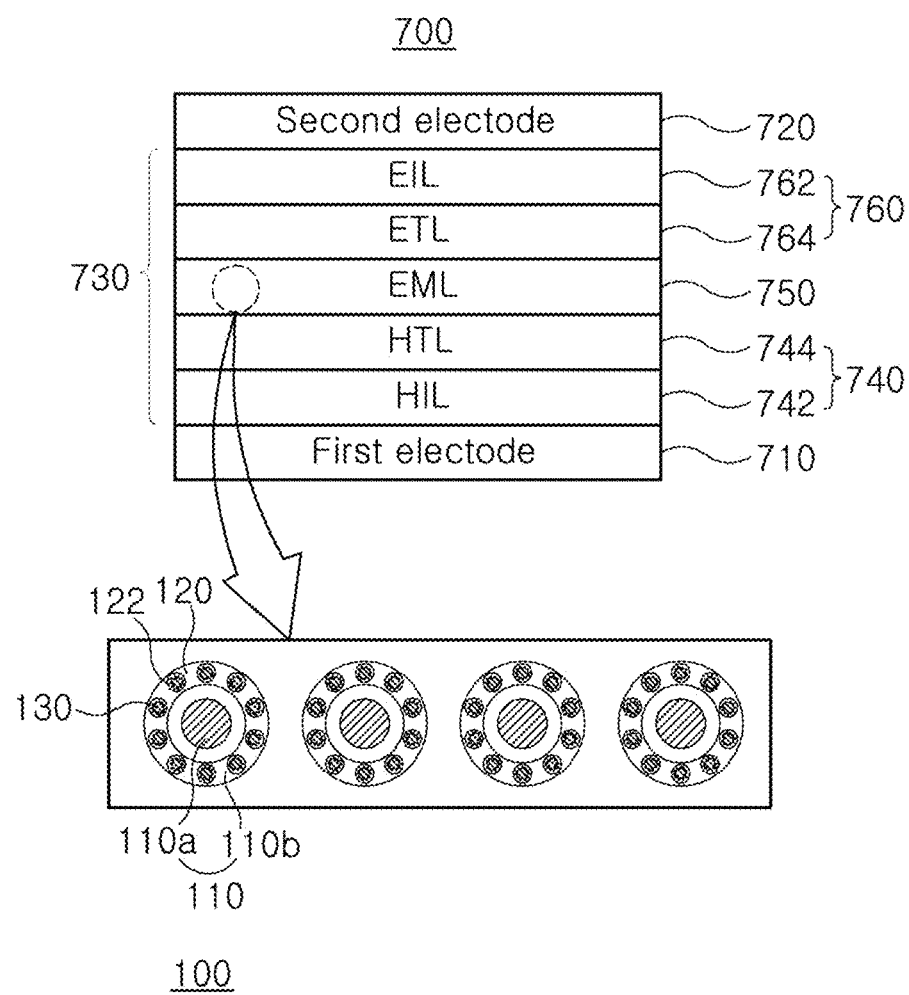
FIGS. 7 and 8 are cross-sectional views schematically illustrating inorganic LEDs according to exemplary embodiments of the present disclosure, respectively, in which an inorganic composite luminescent material is applied to an emitting material layer.

An inorganic composite luminescent material prepared according to the present disclosure has excellent luminous efficiency and an excellent scattering characteristic, and can emit light with various wavelength ranges, and therefore, it can be used as a material for an emitting material layer of an inorganic LED such as a QLED. FIG. 7 is a cross-sectional view schematically illustrating an inorganic LED having a normal structure in which luminescent particles are applied to an emitting material layer according to an exemplary embodiment of the present disclosure.

As shown in FIG. 7, an inorganic LED 700 according to a first exemplary embodiment of the present disclosure includes a first electrode 710, a second electrode 720 disposed opposite the first electrode 710, and an emissive layer 730 disposed between the first electrode 710 and the second electrode 720 and including an emitting material layer (EML) 750. As an example, the emissive layer 730 may further include a first charge transfer layer 740 disposed between the first electrode 710 and the EML 750, and a second charge transfer layer 760 disposed between the EML 750 and the second electrode 720.

In the first exemplary embodiment, the first electrode 710 may be an anode such as a hole injection electrode. The first electrode 710 may be formed on a substrate formed of glass or a polymer (not shown in FIG. 7). As an example, the first electrode 710 may be a doped or undoped metal oxide such as indium-tin-oxide (ITO), indium-zinc-oxide (IZO), indium-tin-zinc oxide (ITZO), indium-copper-oxide (ICO), tin oxide ($SnO_2$), indium oxide ($In_2O_3$), cadmium:zinc oxide (Cd:ZnO), fluorine:tin oxide ($F:SnO_2$), indium:tin oxide ($In:SnO_2$), gallium:tin oxide ($Ga:SnO_2$) or aluminum:zinc oxide (Al:ZnO; AZO). Optionally, the first electrode 710 may consist of a metal or nonmetal material containing nickel (Ni), platinum (Pt), gold (Au), silver (Ag), iridium (Ir) or a carbon nanotube (CNT), other than the above-described metal oxide.

In the first exemplary embodiment, the second electrode 720 may be a cathode such as an electron injection electrode. As an example, the second electrode 720 may consist of Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg. As an example, each of the first electrode 710 and the second electrode 720 may be stacked to a thickness of 30 to 300 nm.

In one exemplary embodiment, in the case of a bottom emission-type light-emitting diode, the first electrode 710 may consist of a transparent conductive metal oxide such as ITO, IZO, ITZO or AZO, and as the second electrode 720, Ca, Ba, Ca/Al, LiF/Ca, LiF/Al, $BaF_2$/Al, Al, Mg, or an Ag:Mg alloy may be used.

The first charge transfer layer 740 that can constitute the emissive layer 730 is disposed between the first electrode 710 and the EML 750. In this exemplary embodiment, the first charge transfer layer 740 may be a hole transport layer which provides holes to the EML 750. As an example, the first charge transfer layer 740 may include a hole injection layer (HIL) 742 disposed adjacent to the first electrode 710 between the first electrode 710 and the EML 750, and a hole transport layer (HTL) 744 disposed adjacent to the EML 750 between the first electrode 710 and the EML 750.

The HIL 742 facilitates the injection of holes from the first electrode 710 into the EML 750. As an example, the HIL 742 may consist of an organic material selected from the group consisting of poly(ethylenedioxythiophene):polystyrenesulfonate (PEDOT:PSS); tetrafluoro-tetracyano-quinodimethane (F4-TCNQ)-doped 4,4',4"-tris(diphenylamino)triphenylamines (TDATA), for example, a p-doped phthalocyanine such as F4-TCNQ-doped zinc phthalocyanine (ZnPc), F4-TCNQ-doped N,N'-diphenyl-N,N'-bis(1-naphthyl)-1,1'-biphenyl-4,4"-diamine (α-NPD); hexaazatriphenylene-hexanitrile (HAT-CN); and a combination thereof, but the present disclosure is not limited thereto. As an example, the dopant such as F4-TCNQ may be used for doping of a host at 1 to 30 wt % with respect to the weight of a host. The HIL 742 may be omitted according to the structure and type of the LED 700.

The HTL 744 transfers holes from the first electrode 710 to the EML 750. The HTL 744 may consist of an inorganic material or an organic material. As an example, the HTL 744 may consist of an organic material, the HTL 744 may be formed of an organic material selected from the group consisting of aryl amines such as 4,4'-N,N'-dicarbazolylbiphenyl (CBP), N,N'-diphenyl-N,N'-bis(1-naphtyl)-1,1'-biphenyl-4,4"-diamine (α-NPD), N,N'-diphenyl-N,N'-bis(3-methylphenyl)-(1,1'-biphenyl)-4,4'-diamine (TPD), N,N'-bis (3-methylphenyl)-N,N'-bis(phenyl)-spiro (spiro-TPD), N,N'-di(4-(N,N'-diphenyl-amino)phenyl)-N,N'-diphenyl-benzidine (DNTPD), 4,4',4"-tris(N-carbazolyl)-triphenylamine (TCTA), tris(3-methylphenylphenylamino)-triphenylamine (m-MTDATA), poly(9,9'-dioctylfluorenyl-2,7-diyl)-co-(4,4'-(N-(4-sec-butylphenyl)diphenylamine (TFB), and poly(4-butylphenyl-dipnehyl amine) (poly-TPD); a polyaniline; a polypyrrole; poly(para)phenylene vinylenes and derivatives thereof such as poly(phenylene vinylene) (PPV), poly[2-methoxy-5-(2-ethylhexyloxy)-1,4-phenylene vinylene] (MEH-PPV), poly[2-methoxy-5-(3',7'-dimethyloctyloxy)-1,4-phenylene vinylene] (MOMO-PPV); a copper phthalocyanine; aromatic tertiary amines or polynuclear aromatic tertiary amines; a 4,4'-bis(p-carbazolyl)-1,1'-biphenyl compound; N,N,N',N'-tetraarylbenzidine; PEDOT:PSS and derivatives thereof; poly(N-vinylcarbazole) (PVK) and derivatives thereof; a polymethacrylate and derivatives thereof; poly(9,9-octylfluorene) and derivatives thereof; poly(spiro-fluorene) and derivatives thereof; N,N'-di(naphthalene-1-yl)-N,N'-diphenyl-benzidine (NPB); Spiro-NPB; and a combination thereof.

When the HTL 744 consists of an inorganic material, the HTL 744 may consist of an inorganic material selected from the group consisting of a metal oxide such as NiO, $MoO_3$, $Cr_2O_3$, $Bi_2O_3$ or p-type ZnO; a non-oxide equivalent such as copper thiocyanate (CuSCN), $Mo_2S$, or p-type GaN; and a combination thereof.

In FIG. 7, while the first charge transfer layer 740 is divided into the HIL 742 and the HTL 744, the first charge transfer layer 740 may be formed as a monolayer. For example, the HIL 742 may be omitted, the first charge transfer layer 740 may consist only of the HTL 744, or the above-described hole transport organic material may be doped with the hole injection material (e.g., PEDOT:PSS).

The first charge transfer layer 740 including the HIL 742 and the HTL 744 may be formed by one selected from a vacuum deposition process including vacuum vapor deposition and sputtering, and a solution process such as spin coating, drop coating, dip coating, spray coating, roll coating, flow coating, casting, screen printing and inkjet printing, or a combination thereof. For example, thicknesses of the HIL 742 and the HTL 744 may range from 10 to 200 nm, and preferably 10 to 100 nm, but the present disclosure is not limited thereto.

On the other hand, the EML 750 may consist of an inorganic composite luminescent material 100 according to the present disclosure. For example, the EML 750 includes an inorganic illuminant 102 (see FIG. 1) consisting of a porous coating 120 surrounding the surface of the inorganic luminescent particle 110 having the heterologous structure of a core 110a and a shell 110b, and scattering agent 130 which can penetrate into at least a portion of a plurality of pores 122 of the porous coating 120. Particularly, when the inorganic luminescent particles 110 such as QD or QR are used as luminescent materials of the EML 750, the color purity of each pixel may be increased, and white light consisting of red (R), green (G) and blue (B) light with high purity may be realized.

In one exemplary embodiment, the EML 750 may be formed by coating the first charge transfer layer 740 with a dispersion containing the inorganic luminescent material 100 in a solvent using a solution process and volatilizing the solvent. The EML 750 may be stacked using one selected from the solution processes such as spin coating, drop coating, dip coating, spray coating, roll coating, flow coating casting, screen printing and inkjet printing, or a combination thereof.

In one exemplary embodiment, the EML 750 may include inorganic light-emitting nanoparticles, QDs or QRs, having photoluminescence (PL) properties at 440 nm, 530 nm, and 620 nm, thereby manufacturing a white LED. Optionally, the EML 750 may include luminescent particles such as QDs or QRs having any one of red, green and blue colors, and may be formed to individually emit any one color.

Meanwhile, the second charge transfer layer 760 is disposed between the EML 750 and the second electrode 720. In this exemplary embodiment, the second charge transfer layer 760 may be an electron transport layer which provides an electron to the EML 750. In one exemplary embodiment, the second charge transfer layer 760 may include an electron injection layer (EIL) 762 disposed adjacent to the second electrode 720 between the second electrode 720 and the EML 750, and an electron transport layer (ETL) 764 disposed adjacent to the EML 750 between the second electrode 720 and the EML 750.

The EIL 762 facilitates the injection of electrons from the second electrode 720 to the EML 750. For example, the EIL 762 may consist of a material in which a metal such as Al, Cd, Cs, Cu, Ga, Ge, In or Li is doped or bonded with fluorine, or of a metal oxide such as titanium dioxide ($TiO_2$), zinc oxide (ZnO), zirconium oxide (ZrO), tin oxide ($SnO_2$), tungsten oxide ($WO_3$) or tantalum oxide ($Ta_2O_3$), which is doped with Al, Mg, In, Li, Ga, Cd, Cs or Cu or not doped.

The ETL 764 is configured to transfer electrons to the EML 750. The ETL 764 may consist of an inorganic material and/or an organic material. When the ETL 764 may be formed of an inorganic material, which is selected from the group consisting of metal or non-metal oxides such as titanium dioxide ($TiO_2$), zinc oxide (ZnO), magnesium zinc oxide (ZnMgO), zirconium oxide (ZrO), tin oxide ($SnO_2$), tungsten oxide ($WO_3$), tantalum oxide ($Ta_2O_3$), hafnium oxide ($HfO_3$), aluminum oxide ($Al_2O3$), zirconium silicon oxide ($ZrSiO_4$), barium titanium oxide ($BaTiO_3$), and barium zirconium oxide ($BaZrO_3$), which are undoped or doped with Al, Mg, In, Li, Ga, Cd, Cs or Cu; semiconductor particles such as CdS, ZnSe and ZnS, which are undoped or doped with Al, Mg, In, Li, Ga, Cd, Cs or Cu; a nitride such as $Si_3N_4$; and a combination thereof.

The ETL 764 may consist of an organic material, which is selected from the group consisting of an oxazole-based compound, an isooxazole-based compound, a triazole-based compound, an isothiazole-based compound, an oxadiazole-based compound, a thiadiazole-based compound, a phenanthroline-based compound, a perylene-based compound, a benzoxazole-based compound, a benzothiazole-based compound, a benzimidazole-based compound, a triazine-based compound, and an aluminum complex.

Specifically, the organic material that can be used to form the ETL 764 may be selected from the materials including 3-(biphenyl-4-yl)-5-(4-tertbutylphenyl)-4-phenyl-4H-1,2,4-triazole (TAZ), bathocuproine (2,9-dimethyl-4,7-diphenyl-1,10-phenanthroline; BCP), 2,2',2"-(1,3,5-benzinetriyl)-tris (1-phenyl-1-H-benzimidazole); TPBi), tris(8-hydroxyquinoline)aluminum (Alq$_3$), bis(2-methyl-8-quninolinato)-4-phenylphenolatealuminum (□) (Balq), bis (2-methyl-quinolinato)(tripnehylsiloxy) aluminum (□) (Salq) and a combination thereof, but the present disclosure is not limited thereto.

Similar to the first charge transfer layer 740, although FIG. 7 illustrates the second charge transfer layer 760 as a bilayer including the EIL 762 and the ETL 764, the second charge transfer layer 760 may be formed as a monolayer only of the ETL 764. In addition, the second charge transfer layer 760 may be formed as a monolayer of the ETL 764 formed of a blend of cesium carbonate with the above-described electron-transporting inorganic material.

The second charge transfer layer 760 including the EIL 762 and/or the ETL 764 may be formed using one selected from solution processes such as spin coating, drop coating, dip coating, spray coating, roll coating, flow coating, casting, screen printing and inkjet printing, or a combination thereof. As an example, each of the EIL 762 and the ETL 764 may be stacked to a thickness of 10 to 200 nm, and preferably, 10 to 100 nm.

For example, when a hybrid charge transfer layer (CTL) in which the HTL 744 constituting the first charge transfer layer 740 is formed of an organic material and the second charge transfer layer 760 is formed of an inorganic material, luminescence characteristics of the LED 700 may be enhanced.

Meanwhile, when holes are transported to the second electrode 720 through the EML 750, or electrons are transported to the first electrode 710 through the EML 750, the lifespan and efficiency of the diode may be reduced. To prevent such reduction, the LED 700 according to a first exemplary embodiment of the present disclosure may include at least one exciton blocking layer disposed adjacent to the EML 750.

For example, the LED 700 according to the first exemplary embodiment of the present disclosure may include an electron blocking layer (EBL) capable of controlling and preventing the transfer of electrons between the HTL 744 and the EML 750.

As an example, the EBL may consist of TCTA, tris[4-(diethylamino)phenyl]amine), N-(biphenyl-4-yl)-9,9-dimethyl-N-(4-(9-phenyl-9H-carbazole-3-yl)phenyl)-9H-fluorene-2-amine, tri-p-tolylamine, 1,1-bis(4-(N,N'-di(ptolyl) amino)phenyl)cyclohexane (TAPC), m-MTDATA, 1,3-bis (N-carbazolyl)benzene (mCP), 3,3'-bis(N-carbazolyl)-1,1'-biphenyl (mCBP), Poly-TPD, copper phthalocyanine (CuPc), DNTPD and/or 1,3,5-tris[4-(diphenylamino)phenyl]benzene (TDAPB).

In addition, a hole blocking layer (HBL), as a second exciton blocking layer, may be disposed between the EML 750 and the ETL 764 to prevent the transfer of holes between the EML 750 and the ETL 764. In one exemplary embodiment, a material for the HBL may be a derivative of an oxadiazole-based compound, a triazole-based compound, a phenanthroline-based compound, a benzoxazole-based compound, a benzothiazole-based compound, a benzimidazole-based compound, a triazine-based compound or the like, which may be used for the ETL 764.

For example, the HBL may consist of 2,9-dimethyl-4,7-diphenyl-1,10-phenanthroline (BCP), BAlq, Alq3, PBD, spiro-PBD and/or Liq, which have/has a deeper highest occupied molecular orbital (HOMO) energy level than that of the material used for the EML 750.

As described above, light with a variety of colors may be emitted according to the composition and components of the inorganic luminescent particle 110 constituting the inorganic composite luminescent material 100, and quantum efficiency may be enhanced using the inorganic luminescent particle 110 having a heterologous structure. As the porous coating 120 is provided to prevent the inorganic luminescent particle 110 from being arranged very close to another, degradation in the luminous efficiency resulting from the FRET phenomenon may be prevented. As the scattering agent 130 penetrate into the porous coating 120, the scattering characteristic and the luminance characteristic of light emitted from the inorganic luminescent particle 110 may be improved. Therefore, the luminous efficiency and the luminance of the inorganic LED 700 including the inorganic composite luminescent material 100 may be enhanced.

Meanwhile, in FIG. 7, the LED having a normal structure, in which the HTL is disposed between the first electrode having a relatively low work function and the EML, and the ETL is disposed between the second electrode having a relatively high work function and the EML, was illustrated. The LED may have an inverted structure, rather than the normal structure, and will be described.

Figure 8:
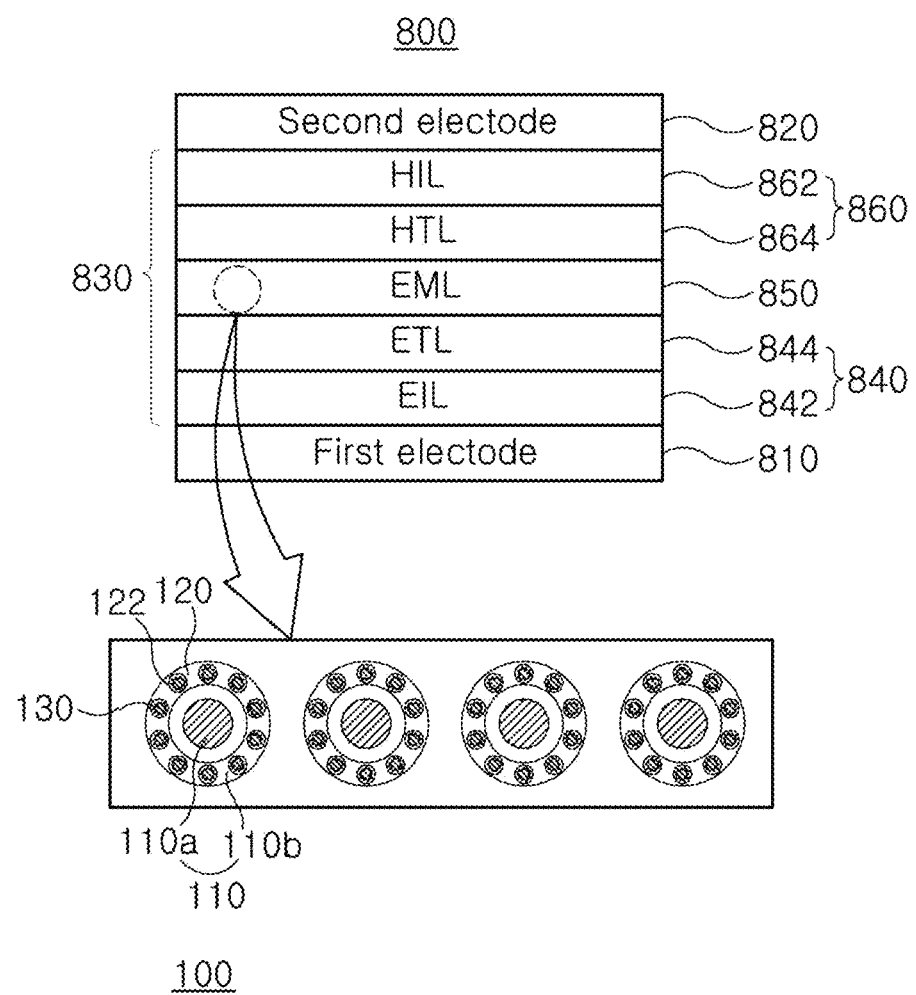

FIG. 8 is a cross-sectional view schematically illustrating an LED having an inverted structure according to the second exemplary embodiment of the present disclosure. As shown in FIG. 8, the LED 800 according to the second exemplary embodiment of the present disclosure includes a first electrode 810, a second electrode 820 disposed opposite the first electrode 810, and an emissive layer 830 disposed between the first electrode 810 and the second electrode 820 and including an EML 850. The emissive layer 830 may further include a first charge transfer layer 840 disposed between the first electrode 810 and the EML 850, and a second charge transfer layer 860 disposed between the second electrode 820 and the EML 850.

In the second exemplary embodiment of the present disclosure, the first electrode 810 may be a cathode such as an electron injection electrode. As an example, the first electrode 810 may be formed of a doped or undoped metal oxide such as ITO, IZO, ITZO, ICO, SnO$_2$, In$_2$O$_3$, Cd:ZnO, F:SnO$_2$, In:SnO$_2$, Ga:SnO$_2$ and AZO, or a material containing Ni, Pt, Au, Ag, Ir or a CNT, other than the above-described metal oxide.

In the second exemplary embodiment of the present disclosure, the second electrode 820 may be an anode such as a hole injection electrode. As an example, the second electrode 820 may be Ca, Ba, Ca/Al, LiF/Ca, LiF/Al, BaF$_2$/Al, CsF/Al, CaCO$_3$/Al, BaF$_2$/Ca/Al, Al, Mg, Au:Mg or Ag:Mg. For example, each of the first electrode 810 and the second electrode 820 may be stacked to a thickness of 30 to 300 nm.

In the second exemplary embodiment of the present disclosure, the first charge transfer layer 840 may be an ETL which provides electrons to the EML 850. In one exemplary embodiment, the first charge transfer layer 840 includes an EIL 842 disposed adjacent to the first electrode 810 between the first electrode 810 and the EML 850, and an ETL 844 disposed adjacent to the EML 850 between the first electrode 810 and the EML 850.

The EIL 842 may consist of a material in which a metal such as Al, Cd, Cs, Cu, Ga, Ge, In or Li is doped or bound with fluorine, or of a metal oxide (e.g., $TiO_2$, ZnO, ZrO, $SnO_2$, $WO_3$, or $Ta_2O_3$), which is undoped or doped with Al, Mg, In, Li, Ga, Cd, Cs or Cu.

The ETL 844 may consist of an inorganic material and/or an organic material. When the ETL 844 may consist of an inorganic material, the ETL 844 may consist of an inorganic material selected from the group consisting of metal/non-metal oxides such as $TiO_2$, ZnO, ZrO, $SnO_2$, $WO_3$, $Ta_2O_3$, $HfO_3$, $Al_2O_3$, $ZrSiO_4$, $BaTiO_3$, and $BaZrO_3$, which are undoped or doped with Al, Mg, In, Li, Ga, Cd, Cs or Cu; semiconductor particles such as CdS, ZnSe and ZnS, which are undoped or doped with Al, Mg, In, Li, Ga, Cd, Cs or Cu; a nitride such as $Si_3N_4$, and a combination thereof.

When the ETL 844 consists of an organic material, the ETL 844 may consist of an organic material such as an oxazole-based compound, an isooxazole-based compound, a triazole-based compound, an isothiazole-based compound, an oxadiazole-based compound, a thiadiazole-based compound, a phenanthroline-based compound, a perylene-based compound, a benzoxazole-based compound, a benzothiazole-based compound, a benzimidazole-based compound, a pyrene-based compound, a triazine-based compound or an aluminum complex. Specifically, the organic material that can be used to form the ETL 844 may be selected from the group consisting of TAZ, BCP, TPBi, 2-[4-(9,10-di-2-naphthalenyl-2-anthracenyl)phenyl]-1-phenyl-1H-benzimidazole, $Alq_3$, Balq, LIQ, Salq and a combination thereof, but the present disclosure is not limited thereto.

However, the first charge transfer layer 840 be formed as a monolayer only of the ETL 844. Alternatively, the first charge transfer layer 840 may be formed as a monolayer of the ETL 844 formed by blending cesium carbonate with the above-described electron-transporting inorganic material. As an example, each of the EIL 842 and the ETL 844 may be stacked to a thickness of 10 to 200 nm, and preferably, 10 to 100 nm.

The EML 850 may consist of an inorganic composite luminescent material 100 which includes an inorganic illuminant 102 (see FIG. 1) formed by a porous coating 120 surrounding the surface of an inorganic luminescent particle 110, and scattering agent 130 which can penetrate into at least a portion of the plurality of pores 122 of the porous coating 120. The organic luminescent particle 110 may be QD or QR having the heterologous structure of a core 110a and a shell 110b.

When the EML 850 consists of an inorganic luminescent particle such as a QD or QR, the EML 850 is formed by applying a solution containing the QDs or QRs in a solvent onto the first charge transfer layer 840, for example, the ETL 844 using a solution process, and volatilizing the solvent.

Meanwhile, in the second exemplary embodiment of the present disclosure, the second charge transfer layer 860 may be a hole transfer layer providing holes to the EML 850. In one exemplary embodiment, the second charge transfer layer 860 includes a HIL 862 disposed adjacent to the second electrode 820 between the second electrode 820 and the EML 850, and a HTL 864 disposed adjacent to the EML 850 between the second electrode 820 and the EML 850.

The HIL 862 may consist of a material selected from the group consisting of PEDOT:PSS, F4-TCNQ-doped TDATA, such as a p-doped phthalocyanine (e.g., F4-TCNQ-doped ZnPc), F4-TCNQ-doped α-NPD, HAT-CN and a combination thereof, but the present disclosure is not limited thereto. As an example, a dopant such as F4-TCNQ may be used for doping of a host at a quantity of 1 to 30 wt % with respect to the weight of a host. The HIL 862 may be omitted according to the structure and type of the LED 800.

The HTL 864 may consist of an inorganic material or an organic material. As an example, the HTL 864 may consist of an organic material selected from the group consisting of aryl amines such as CBP, α-NPD, TPD, spiro-TPD, DNTPD, TCTA, m-MTDATA, TFB and poly-TPD; a polyaniline; a polypyrrole; poly(para)phenylenevinylenes such as PPV, MEH-PPV and MOMO-PPV and derivatives thereof; copper phthalocyanine; aromatic tertiary amines or polynuclear tertiary amines; 4,4'-bis(p-carbazolyl)-1,1'-biphenyl compounds; N,N,N',N'-tetraarylbenzidine; PEDOT:PSS and derivatives thereof; poly-N-vinylcarbazole and derivatives thereof; polymethacrylate and derivatives thereof; poly(9,9-octylfluorene) and derivatives thereof; poly(spiro-fluorene) and derivatives thereof; NPB; Spiro-NPB and a combination thereof.

When the HTL 864 consists of an inorganic material, the HTL 864 may consist of an inorganic material selected from the group consisting of metal oxides such as NiO, $MoO_3$, $Cr_2O_3$, $Bi_2O_3$ and p-type ZnO; non-oxidized equivalents such as copper thiocyanate (CuSCN), $Mo_2S$, and p-type GaN; and a combination thereof.

The second charge transfer layer 860 may be formed as a monolayer. For example, the second charge transfer layer 860 may consist only of the HTL 864 without the HIL 862, or may be prepared by doping the above-described hole-transporting organic material with a hole injection material (e.g., PEDOT:PSS). Thicknesses of the HIL 862 and the HTL 864 may range from 10 to 200 nm, and preferably 10 to 100 nm, but the present disclosure is not limited thereto.

Similar to the first exemplary embodiment, the LED 800 according to the second exemplary embodiment of the present disclosure may include at least one exciton blocking layer disposed adjacent to the EML 850. For example, the LED 800 may further include an EBL disposed between the EML 850 and the HTL 864 to control and prevent the transfer of electrons, and an HBL disposed between the ETL 844 and the EML 850 to control and prevent the transfer of holes.

Light with a variety of colors may be emitted according to the composition and components of the inorganic luminescent particles 110, and quantum efficiency may be enhanced using the inorganic luminescent particles 110 having a heterologous structure. Due to the porous coating 120, the inorganic luminescent particles 110 may not approach close to another at a predetermined distance or less, the luminous efficiency resulting from the FRET phenomenon may be prevented. As the scattering agent 130 penetrates into the porous coating 120, the scattering characteristic and the luminance characteristic of light emitted from the inorganic luminescent particle 110 may be improved. Accordingly, the luminous efficiency and the luminance of the inorganic LED 800 including the inorganic composite luminescent materials 100 may be enhanced.

Figure 9:
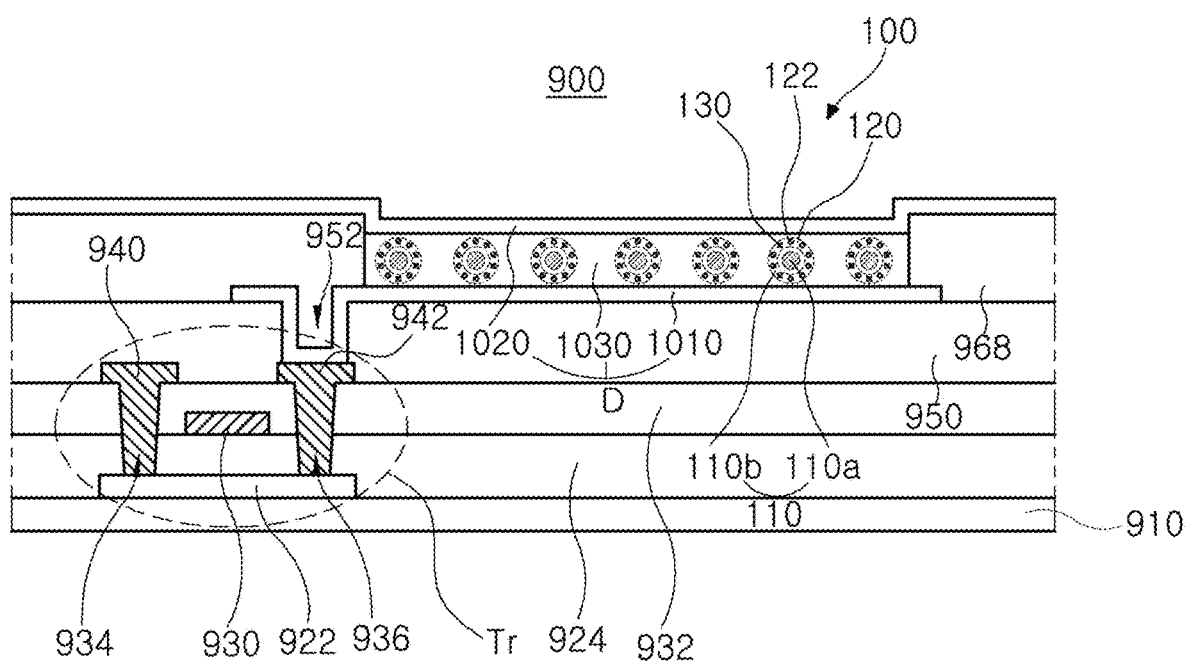
FIG. 9 is a cross-sectional view schematically illustrating an inorganic light-emitting display device according to an exemplary embodiment of the present disclosure, to which an inorganic LED is applied.

Accordingly, the inorganic LED in which the inorganic composite luminescent material according to the present disclosure is applied to the EML may be applied to a light-emitting apparatus such as a lighting device or a display device. As an example, a light-emitting apparatus having the LED in which the inorganic composite luminescent material according to the present disclosure is applied to the EML will be described. FIG. 9 is a cross-sectional view schematically illustrating an inorganic light-emitting display device according to an exemplary embodiment of the present disclosure.

As shown in FIG. 9, an inorganic light-emitting display device 900 includes a substrate 910, a thin film transistor Tr, which is a driving element disposed on the substrate 910, and a LED (D) connected to the thin film transistor Tr.

A semiconductor layer 922 consisting of an oxide semiconductor material or polycrystalline silicon is formed on the substrate 910. When the semiconductor layer 922 consists of an oxide semiconductor material, a screening pattern (not shown) may be formed under the semiconductor layer 922 to prevent light from being incident upon the semiconductor layer 922, and thus prevent degradation of the semiconductor layer 922 due to light. In contrast, the semiconductor layer 922 may consist of polycrystalline silicon, and in this case, opposite edges of the semiconductor layer 922 may be doped with impurities.

A gate insulating film 924 consisting of an insulating material is formed on the semiconductor layer 922. The gate insulating film 924 may consist of an inorganic insulating material such as silicon oxide ($SiO_2$) or silicon nitride (SiNx). A gate electrode 930 consisting of a conductive material such as a metal is formed on the gate insulating film 924 to correspond to the center of the semiconductor layer 922.

An interlayer insulating film 932 consisting of an insulating material is formed on the gate electrode 930. The interlayer insulating film 932 may be formed of an inorganic insulating material such as silicon oxide ($SiO_2$) or silicon nitride (SiNx), or an organic insulating material such as benzocyclobutene or photo-acryl.

The interlayer insulating film 932 has first and second semiconductor layer contact holes 934 and 936 exposing both sides of the semiconductor layer 922. The first and second semiconductor layer contact holes 934 and 936 are disposed on either side of the gate electrode 930 such that they are spaced apart from the gate electrode 930. A source electrode 940 and a drain electrode 942, which consist of a conductive material such as a metal, are formed on the interlayer insulating film 932.

The source electrode 940 and the drain electrode 942 are disposed on either side of the gate electrode 930 such that they are spaced apart from the gate electrode 930, and connected to both opposite sides of the semiconductor layer 922 via the first and second semiconductor layer contact holes 934 and 936.

The thin film transistor Tr, which is a driving element, includes the semiconductor layer 922, the gate electrode 930, the source electrode 940, and the drain electrode 942.

In FIG. 9, the thin film transistor Tr has a coplanar structure in which the gate electrode 930, the source electrode 940 and the drain electrode 942 are disposed on the semiconductor layer 922. Alternatively, the thin film transistor Tr may have an inverted staggered structure in which a gate electrode is disposed under the semiconductor layer, and a source electrode and a drain electrode are disposed on the semiconductor layer. In this case, the semiconductor layer may consist of amorphous silicon.

Although not shown in FIG. 9, pixel areas are defined by gate lines and data lines that cross one another, and a switching element linked to the gate line and the data line is further provided. The switching element is linked to the thin film transistor Tr, which is a driving element. In addition, a power line disposed spaced apart from and parallel to the gate line or data line, and a storage capacitor may be further included to constantly maintain a voltage of the gate electrode of the thin film transistor Tr, which is a driving element, during one frame.

Meanwhile, a passivation layer 950 having the drain contact hole 952 through which the drain electrode 942 of the thin film transistor Tr is exposed , covers the driving thin film transistor Tr.

A first electrode 1010 connected to the drain electrode 942 of the thin film transistor Tr though the drain contact hole 952 is formed on the passivation layer 950 for each pixel area. The first electrode 1010 may be an anode or a cathode, and may consist of a conductive material having a relatively high work function. For example, the first electrode 1010 may consist of a doped or undoped metal oxide such as ITO, IZO, ITZO, ICO, $SnO_2$, $In_2O_3$, Cd:ZnO, F:$SnO_2$, In: $SnO_2$, Ga: $SnO_2$ or AZO, or other than the above-mentioned metal oxide, a metallic material including nickel (Ni), platinum (Pt), gold (Au), silver (Ag), or iridium (Ir) or a CNT.

Meanwhile, when the light-emitting display device 900 of the present disclosure is a top-emission type, a reflective electrode or a reflective layer may be further formed under the first electrode 1010. For example, a reflective electrode or a reflective layer may consist of an aluminum-palladium-copper (APC) alloy.

In addition, a bank layer 968 is formed to cover the both ends of the first electrode 1010 on the passivation layer 950. The bank layer 968 is configured to expose the center of the first electrode 1010 corresponding to the pixel area.

An emissive layer 1030 including the inorganic composite luminescent material 100 according to the present disclosure is formed on the first electrode 1010. The emissive layer 1030 may consist of only the EML, or may have a plurality of charge transfer layers in order to increase luminous efficiency. As an example, the first charge transfer layer 740 or 840 (see FIGS. 6 and 7) may be formed between the first electrode 1010 and the emissive layer 1030, and a second charge transfer layer 760 or 860 (see FIGS. 7 and 8) may be further formed between the emissive layer 1030 and the second electrode 1020.

The second electrode 1020 is formed on the emissive layer 1030 formed on the substrate 910. The second electrode 1020 may be disposed over the entire surface of a display area, consist of a conductive material having a relatively low work function, and may be a cathode or anode. For example, the second electrode 1020 may be Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg.

For example, the inorganic composite luminescent material 100 includes an inorganic illuminant 102 (see FIG. 1) consisting of a porous coating 120 surrounding the surface of the inorganic luminescent particle 110, and scattering agent 130 which penetrates into at least a portion of a plurality of pores 122 formed in the porous coating 120. The inorganic luminescent particles 110 constituting the inorganic composite luminescent material 100 according to the present disclosure may consist of the heterologous structure of a core 110a and a shell 110b. As a compositional ratio of the components of the core 110a may be changed, or a thickness of the shell 110b is adjusted, luminescence in various wavelength bands may be realized. In addition, as the porous coating 120 is provided to prevent the inorganic luminescent particles 110 from being arranged very close to each other, degradation of the luminous efficiency resulting from the FRET phenomenon may be prevented. As the scattering agent 130 penetrates into the porous coating 120, light emitted from the inorganic luminescent particles 110 may be effectively scattered. Therefore, the luminance and the luminous efficiency of the inorganic LED (D) to which the inorganic composite luminescent material 100 according to the present disclosure is applied are enhanced, and thus the luminance and the luminous efficiency of the inorganic light-emitting display device 900 may also enhanced.

Hereinafter, the present disclosure will be described according to the following examples, but the present disclosure is not limited to the technical ideas described in the following examples.

SYNTHESIS EXAMPLE 1

Synthesis of Inorganic Illuminant

An inorganic illuminant having a porous silica coating (second shell) surrounding the surface of QD having a core-shell structure, was synthesized by the following method. 3.0 μM of QD (InP/ZnS$_2$/ZnS; electroluminescence peak: 628 nm; InP is an inner component, ZnS$_2$ is a first outer component, and ZnS is a second outer component) dissolved in 0.5 mL of chloroform was mixed with 2.5 mL (137.5 μM) of a pore-forming agent, which was a cetyltrimethylammonium bromide (CTAB) aqueous solution (55 mM), and stirred, thereby preparing a homogenized microemulsion. The mixture was heated at 50° C. for approximately 15 minutes to evaporate the chloroform, thereby preparing a CTAB-stabilized clear QD aqueous solution. The QD aqueous solution was diluted with 45 mL NaOH solution (13 mM) which was previously heated at 50° C., 0.5 mL of tetraethyl orthosilicate (TEOS) and 3 mL of ethylacetate were added thereto, and then the reaction continued for 15 minutes while stirring. The resulting mixture was slowly cooled to a room temperature, and then the silica-encapsulated QDs were repeatedly washed with ethanol to remove an unreacted precursor, thereby synthesizing an inorganic illuminant having a QD surface surrounded by a porous silica coating.

SYNTHESIS EXAMPLE 2

Synthesis of Inorganic Illuminant

An inorganic illuminant having a QD surface surrounded by a porous silica coating was synthesized in the same manner as described in Synthesis Example 1, except that the content of CTAB, which is a pore-forming agent, was adjusted to 5.0 mL (275 μM).

SYNTHESIS EXAMPLE 3

Synthesis of Inorganic Illuminant

An inorganic illuminant having a QD surface surrounded by a porous silica coating was synthesized in the same manner as described in Synthesis Example 1, except that the content of CTAB, which is a pore-forming agent, was adjusted to 10.0 mL (550 μM).

SYNTHESIS EXAMPLE 4

Synthesis of Inorganic Illuminant

An inorganic illuminant having a QD surface surrounded by a porous silica coating was synthesized in the same manner as described in Synthesis Example 1, except that the content of CTAB, which is a pore-forming agent, was adjusted to 5.0 mL (275 μM), and the amount of TEOS added herein was adjusted 1.0 mL.

SYNTHESIS EXAMPLE 5

Synthesis of Inorganic Illuminant

An inorganic illuminant having a QD surface surrounded by a porous silica coating was synthesized in the same manner as described in Synthesis Example 1, except that the content of CTAB, which is a pore-forming agent, was adjusted to 5.0 mL (275 μM), and the amount of TEOS added herein was adjusted to 1.5 mL.

EXPERIMENTAL EXAMPLE 1

Confirmation of Pore Size and Uniformity of Surface of Inorganic Illuminant

Figure 10A:
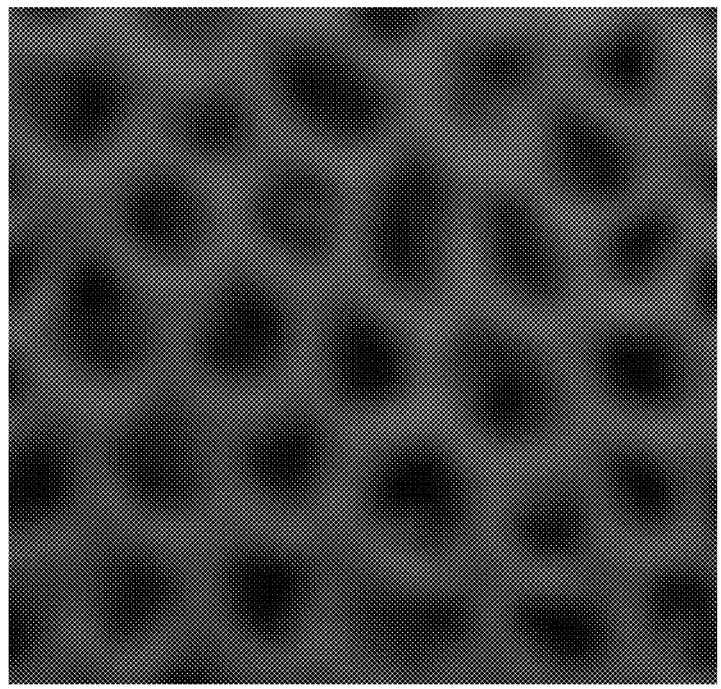
FIGS. 10A and 10B are transmission electron microscope (TEM) images showing the shape of pores of an inorganic illuminant in which a porous coating is formed on the surface of an inorganic luminescent particle according to an exemplary embodiment of the present disclosure.
Figure 10B:
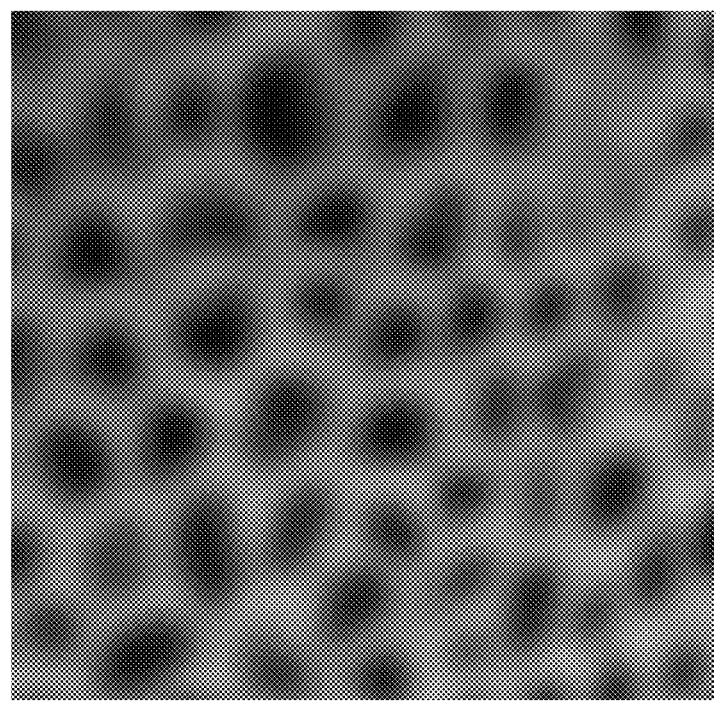
Figure 11:
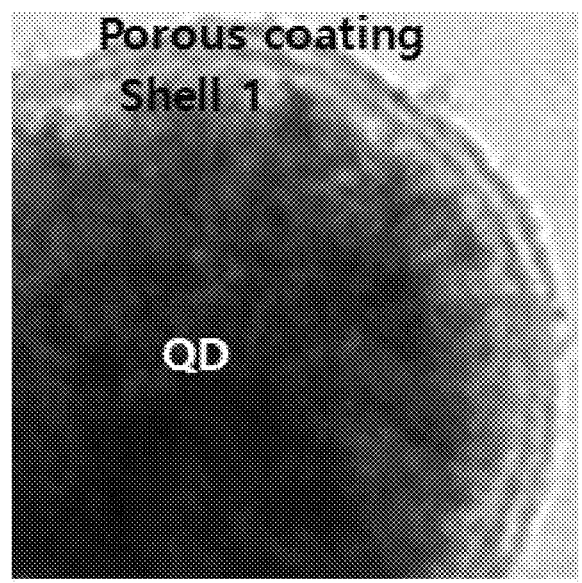
FIG. 11 is a TEM image showing a cross-sectional structure of an inorganic illuminant in which a porous coating is formed on the surface of a an inorganic luminescent particle according to another exemplary embodiment of the present disclosure.

The size and uniformity of pores formed in a porous silica coating constituting an outer surface of each of the inorganic illuminants synthesized in Synthesis Examples 1 to 5 were measured using a transmission electron microscope (TEM). FIGS. 10A and 10B are electron microscope images of the surfaces of the inorganic illuminants manufactured in Synthesis Examples 1 and 2, respectively. Average sizes of the pores formed in silica surfaces of the inorganic illuminants manufactured in Synthesis Examples 1 to 3 were 5 to 7 nm, 3 to 4 nm, and 2 to 6 nm, respectively. In addition, it was confirmed that the pores were very uniformly formed in the surfaces of the inorganic illuminants manufactured in Synthesis Examples 1 and 2. In addition, FIG. 11 shows a TEM image of the cross-sectional structure of the inorganic illuminant prepared in Synthesis Example 2. It was confirmed that porous silica coating was uniformly formed in a QD surface. In Synthesis Examples 4 and 5, even by increasing the content of TEOS, the size of pores formed in a silica-coated surface was the same as that in Synthesis Example 2.

EXAMPLE 1

Preparation of Inorganic Composite Luminescent Material

Based on the inorganic illuminant synthesized in Synthesis Example 2, an inorganic composite luminescent material to which 5 wt % of polarized TiO$_2$ (average particle size: 3 nm), which is an inorganic scattering agent, was prepared. Subsequently, the following luminescence characteristics were evaluated.

COMPARATIVE EXAMPLE 1

QDs

The following luminescence characteristics were evaluated using QDs which were not surrounded by a porous silica coating.

COMPARATIVE EXAMPLE 2

Inorganic Illuminant

The following luminescence characteristics were evaluated using an inorganic illuminant in which a QD surface was surrounded by a porous silica coating without adding scattering agent.

COMPARATIVE EXAMPLE 3

Preparation of Inorganic Composite Luminescent Material

The following luminescence characteristics were evaluated by preparing an inorganic composite luminescent material by repeating the procedures of Example 1, except that 5 wt % of $TiO_2$ having an average particle size of 6 nm as an inorganic scattering matter was added with respect to an inorganic illuminant.

EXPERIMENTAL EXAMPLE 2

Evaluation of Physical Properties of Inorganic Luminescent Material

Luminance, luminescence characteristics such as photoluminescence quantum yield (PLQY) and internal quantum efficiency, and stability were evaluated for a luminescent material prepared in each of Example 1 and Comparative Examples 1 to 3. A Luminance of each of the luminescent materials prepared in Example 1 and Comparative Examples 1 to 3 were compared to each other under measurement conditions of a green wavelength of 536 nm and 6V, the initial emission wavelength of the inorganic illuminant synthesized in Synthesis Example 1 was 628 nm, the luminance was 697 cd/m², and the stability was evaluated by measuring a luminance after the sample was maintained at 120° C. for 30 minutes. The result of measuring the physical properties of the inorganic composite luminescent materials according to the example and the comparative examples is shown in Table 1 and FIG. 12.

TABLE 1

Evaluation of physical properties of inorganic composite luminescent material

|  | Luminance (cd/m²) | PLQY (%) | Stability (cd/m²) |
|---|---|---|---|
| Example 1 | 1243 | 42.84 | Stable |
| Comparative Example 1(QDs) | 485 | Lamp off | 168 |
| Comparative Example 2 (without scattering agent) | 697 | 5.08 | Stable |
| Comparative Example 3 (with scattering agent having large diameter) | 988 | Lamp off | Stable |

Figure 12:
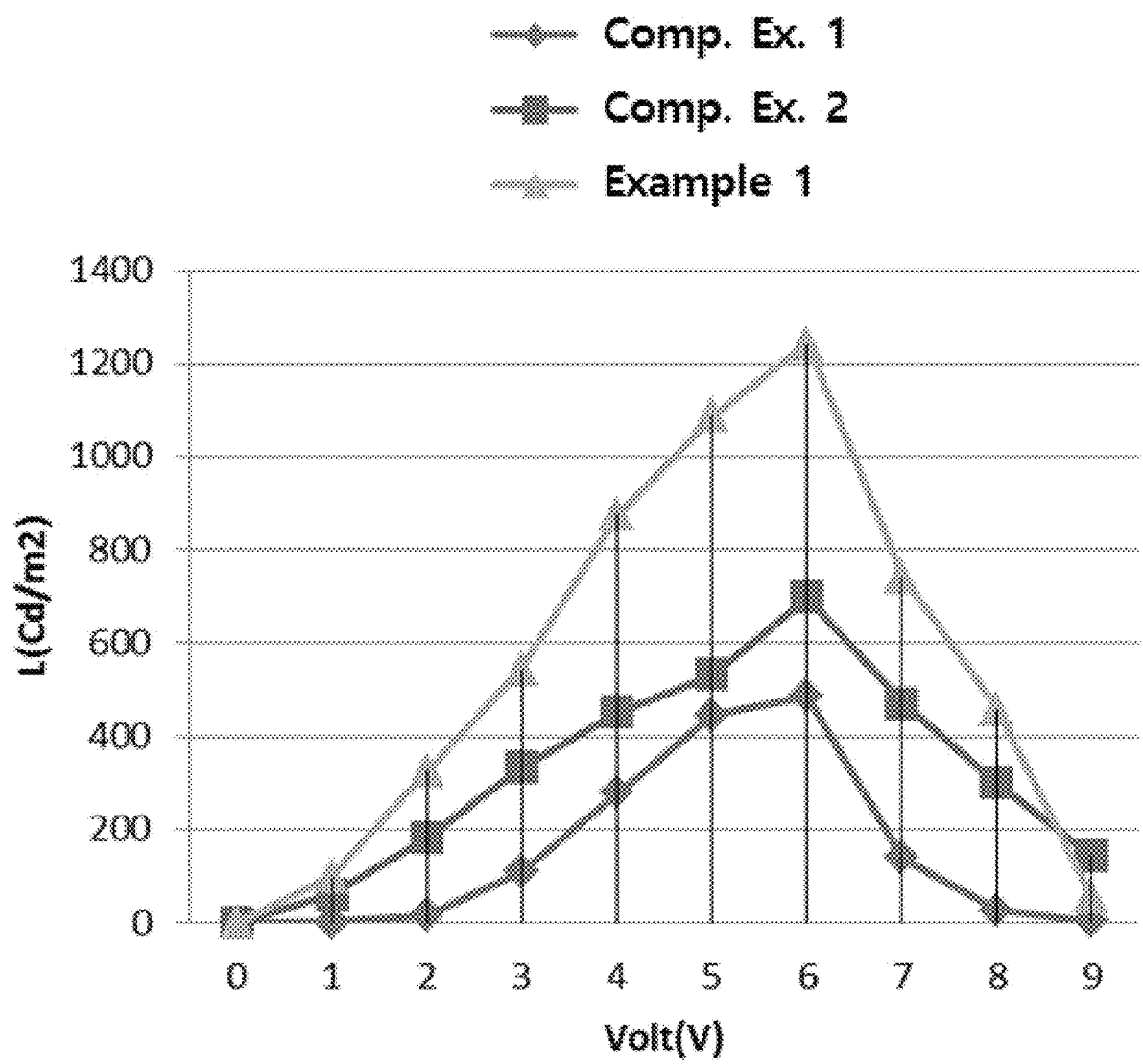
FIG. 12 is a graph showing a result of measuring luminance of an inorganic composite luminescent material according to an exemplary embodiment of the present disclosure as a function of an applied voltage.

As shown in Table 1 and FIG. 12, compared with the case of using only QDs (Comparative Example 1), the inorganic illuminant in which a QD surface is surrounded by a porous silica coating (Comparative Example 2) was increased in luminance, and its PLQY was only 5.08%. In addition, in the case that the scattering agent did not penetrate into the pores in the porous silica coating (Comparative Example 3), luminance increased, but agglomeration of scattering agent occurred. In contrast, when the QD surface is surrounded by porous silica coating, and the scattering agent capable of penetrating into the pores formed in the surface of the porous silica coating (Example), the luminance increased 156.2% compared with when only QD was used, and increased 78.3% compared with when scattering agent was not used. The luminance increased 25.8% compared with when scattering agent that did not penetrate into pores. As a result, it was confirmed that, according to the present disclosure, an inorganic composite luminescent material which was improved in luminance and luminous efficiency, can be applied to a light-emitting film, an LED package, or a light-emitting apparatus.

An inorganic composite luminescent material according to the present disclosure includes an inorganic illuminant including a porous coating surrounding the surface of an inorganic luminescent particle, and scattering agent which can penetrate into pores of the porous coating.

Light with various wavelengths can be emitted by changing the composition and components of the inorganic luminescent particle. Due to the porous coating, the inorganic luminescent particles realizing luminescence can be arranged not to be close to one another within a specific distance, and thus energy transferred to an adjacent inorganic luminescent particle due to a FRET phenomenon is prevented, thereby preventing degradation of luminescence characteristics.

In addition, the penetration of a scattering agent to the surface of the inorganic illuminant can result in effective transmission and scattering of light emitted from the inorganic luminescent particle toward the outside. Therefore, the inorganic composite luminescent material suggested in the present disclosure can be widely applied to a light-emitting film, an LED package, a LED or a light-emitting apparatus, which is improved in luminous efficiency and luminance.

While the present disclosure has been described with reference to exemplary embodiments and examples, these embodiments and examples are not intended to limit the scope of the present disclosure. Rather, it will be apparent to those skilled in the art that various modifications and variations can be made in the present disclosure without departing from the spirit or scope of the invention. Thus, it is intended that the present invention cover the modifications and variations of the present disclosure provided they come within the scope of the appended claims and their equivalents.

What is claimed is:

1. An inorganic composite luminescent material comprising inorganic illuminants, an inorganic illuminant including:
    an inorganic luminescent particle;
    a porous coating surrounding the inorganic luminescent particle, the porous coating having a plurality of pores; and
    scattering agents within at least a portion of the plurality of pores in the porous coating of the inorganic illuminants.

2. The inorganic composite luminescent material of claim 1, wherein the scattering agents are formed from at least one of silicone, silica ($SiO_2$), alumina ($Al_2O_3$), titania ($TiO_2$), zirconia ($ZrO_2$), barium sulfate ($BaSO_4$), zinc oxide (ZnO), and magnesium fluoride (MgF).

3. The inorganic composite luminescent material of claim 1, wherein the inorganic composite luminescent material includes 1 to 30 parts by weight of the scattering agents with respect to 100 parts by weight of the inorganic illuminants.

4. The inorganic composite luminescent material of claim 1,
    wherein the inorganic luminescent particle is at least one of a quantum dot, a quantum rod, and a phosphor.

5. The inorganic composite luminescent material of claim 4, wherein the inorganic luminescent particle is a quantum dot including a core and a shell enclosing the core.

6. The inorganic composite luminescent material of claim 1, wherein the porous coating is formed of at least one of silica ($SiO_2$), titania ($TiO_2$), alumina ($Al_2O_3$), zirconia ($ZrO_2$), zinc oxide (ZnO), niobium, zirconium, cerium, and silicate.

7. The inorganic composite luminescent material of claim 1, wherein the plurality of pores of the porous coating have an average diameter less than 2 nm.

8. The inorganic composite luminescent material of claim 1, wherein the plurality of pores of the porous coating have an average diameter of 2 nm or more and less than 50 nm.

9. The inorganic composite luminescent material of claim 1, wherein the plurality of pores of the porous coating have an average diameter of 50 nm or more.

10. The inorganic composite luminescent material of claim 1, wherein a distance between the inorganic luminescent particles is greater than a thickness of the porous coating.

11. A light-emitting film comprising:
a matrix resin; and
the inorganic composite luminescent material of claim 1 dispersed in the matrix resin.

12. The light-emitting film of claim 11,
wherein a refractive index of the scattering agents is greater than a refractive index of the matrix resin, and
wherein the refractive index of the scattering agents is smaller than a refractive index of the inorganic luminescent particle.

13. A liquid crystal display (LCD) device comprising:
a backlight unit configured to emit light;
a liquid crystal panel; and
the light-emitting film of claim 11 disposed between the backlight unit and the liquid crystal panel.

14. A light emitting diode (LED) package comprising:
a LED chip configured to emit light; and
an encapsulation part covering the LED chip and including the inorganic composite luminescent material of claim 1 and a matrix resin in which the inorganic composite luminescent material is dispersed.

15. The light emitting diode (LED) package of claim 14,
wherein a refractive index of the scattering agents is greater than a refractive index of the matrix resin, and
wherein the refractive index of the scattering agents is smaller than a refractive index of the inorganic luminescent particle.

16. A display device comprising:
a backlight unit including a LED assembly, the LED assembly including the light emitting diode (LED) package of claim 14; and
a display panel on the backlight unit.

17. A light emitting diode (LED) comprising:
a first electrode;
a second electrode; and
an emissive layer disposed between the first electrode and the second electrode, the emissive layer including the inorganic composite luminescent material of claim 1.

18. A light-emitting device comprising:
a substrate; and
the light emitting diode of claim 17 on the substrate.

19. A light emitting diode (LED) comprising:
a first electrode;
a second electrode; and
an emissive layer disposed between the first electrode and the second electrode, the emissive layer including an inorganic composite luminescent material comprising inorganic illuminants, wherein the inorganic illuminants comprising:
an inorganic luminescent particle; and
a porous coating surrounding the inorganic luminescent particle, the porous coating having a plurality of pores,
wherein the inorganic luminescent particle is at least one of a quantum dot and a quantum rod.

* * * * *